US011400561B2

(12) United States Patent
Kobayashi et al.

(10) Patent No.: US 11,400,561 B2
(45) Date of Patent: Aug. 2, 2022

(54) TOP RING FOR HOLDING A SUBSTRATE AND SUBSTRATE PROCESSING APPARATUS

(71) Applicant: EBARA CORPORATION, Tokyo (JP)

(72) Inventors: Kenichi Kobayashi, Tokyo (JP); Asagi Matsugu, Tokyo (JP); Makoto Kashiwagi, Tokyo (JP); Manao Hoshina, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 180 days.

(21) Appl. No.: 16/530,129

(22) Filed: Aug. 2, 2019

(65) Prior Publication Data
US 2020/0039024 A1 Feb. 6, 2020

(30) Foreign Application Priority Data
Aug. 2, 2018 (JP) .............................. JP2018-146096

(51) Int. Cl.
*B24B 37/32* (2012.01)
(52) U.S. Cl.
CPC ................................. *B24B 37/32* (2013.01)
(58) Field of Classification Search
CPC ......... B24B 37/27; B24B 37/28; B24B 37/30; B24B 37/32; B24B 37/04; B24B 37/042
USPC ............................. 451/397, 398, 5, 8, 9, 10
See application file for complete search history.

(56) References Cited

U.S. PATENT DOCUMENTS

| | | | | |
|---|---|---|---|---|
| 6,033,520 A * | 3/2000 | Kimura | ................... | B24B 37/32 156/345.14 |
| 6,293,858 B1 * | 9/2001 | Kimura | ................... | B24B 37/32 451/287 |
| 6,612,903 B2 * | 9/2003 | Korovin | ................... | B24B 37/30 451/286 |
| 6,916,234 B2 * | 7/2005 | Suwabe | ................... | B24B 37/32 451/186 |
| 8,083,571 B2 * | 12/2011 | Nabeya | ................... | B24B 37/32 451/9 |
| 8,100,743 B2 * | 1/2012 | Nabeya | ................... | B24B 37/32 451/286 |
| 9,039,488 B2 * | 5/2015 | Duescher | ................ | B24B 37/10 451/287 |

(Continued)

FOREIGN PATENT DOCUMENTS

JP 2003-048149 A 2/2003
JP 2003048149 A * 2/2003
(Continued)

*Primary Examiner* — Joseph J Hail
*Assistant Examiner* — Jonathan R Zaworski
(74) *Attorney, Agent, or Firm* — BakerHostetler

(57) ABSTRACT

According to one embodiment, there is provided a top ring for holding a substrate. The top ring comprises a substrate supporting surface, a retainer member disposed to surround an outer periphery of the substrate supporting surface, and a retainer guiding device configured to guide the retainer member so as to allow the retainer member to be displaced in a direction perpendicular to the substrate supporting surface, and support the retainer member so as to inhibit the retainer member from being displaced in a direction parallel to and away from the substrate supporting surface. The retainer guiding device is disposed in an inner side of the retainer member surrounding the substrate supporting surface.

18 Claims, 21 Drawing Sheets

(56) References Cited

U.S. PATENT DOCUMENTS

| | | | | |
|---|---|---|---|---|
| 9,818,619 | B2* | 11/2017 | Kim | B24B 37/30 |
| 2003/0036340 | A1* | 2/2003 | Moriya | B24B 37/042 |
| | | | | 430/5 |
| 2003/0176149 | A1* | 9/2003 | Yoshida | B24B 49/10 |
| | | | | 451/10 |
| 2008/0085658 | A1* | 4/2008 | Katsuoka | B24B 37/04 |
| | | | | 451/7 |
| 2009/0111362 | A1* | 4/2009 | Nabeya | B24B 37/32 |
| | | | | 451/64 |
| 2009/0311945 | A1* | 12/2009 | Strasser | B24B 37/32 |
| | | | | 451/8 |
| 2015/0151401 | A1* | 6/2015 | Shinozaki | B24B 49/08 |
| | | | | 451/5 |

FOREIGN PATENT DOCUMENTS

| | | |
|---|---|---|
| JP | 2006-255851 A | 9/2006 |
| JP | 2009-131946 A | 6/2009 |

* cited by examiner

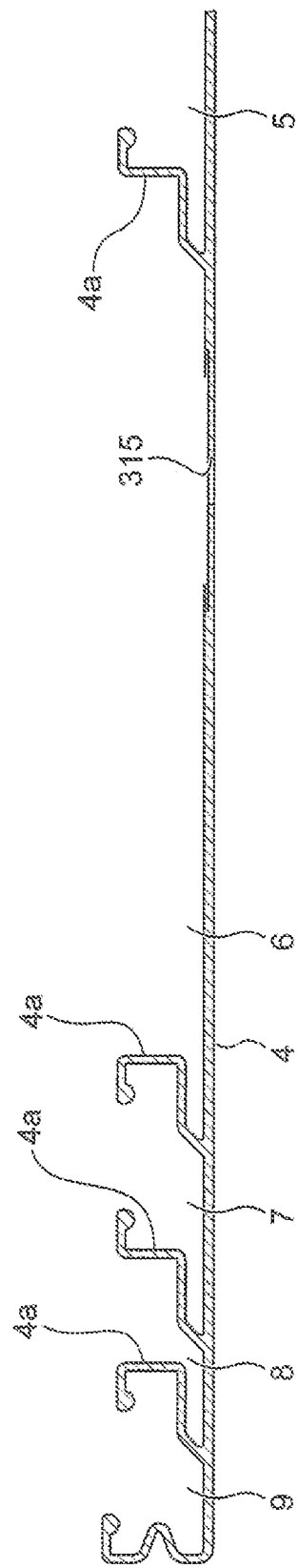

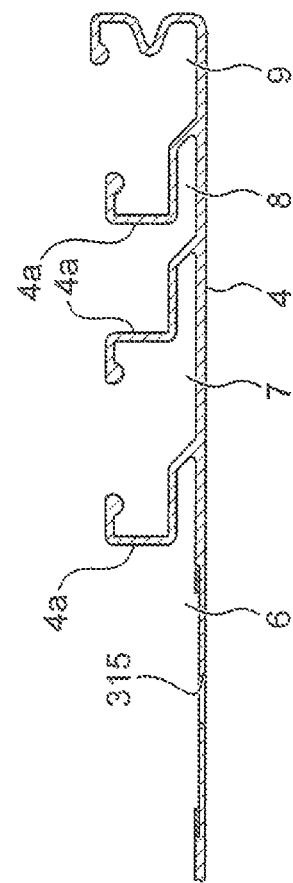

TOP RING FOR HOLDING A SUBSTRATE AND SUBSTRATE PROCESSING APPARATUS

CROSS-REFERENCE TO RELATED APPLICATION

This application is based upon and claims the benefit of priority of the prior Japanese Patent Application No. 2018-146096, filed on Aug. 2, 2018, the entire content of which is incorporated herein by reference.

TECHNICAL FIELD

The present patent application relates to a top ring for holding a substrate and to a substrate processing apparatus.

BACKGROUND ART

At the time of manufacture of semiconductive apparatuses, a chemical mechanical polishing (CMP) apparatus is used to planarize the surfaces of substrates. The substrates used in the manufacture of semiconductive apparatuses usually have a circular disc-like shape. There has been a growing demand for greater flatness to be achieved in planarizing the surfaces of not only semiconductive apparatuses but also quadrangular substrates, such as CCL substrates (Copper Clad Laminate substrates), PCB (Printed Circuit Board) substrates, photomask substrates, and display panels. There also has been a growing demand for planarization of the surfaces of package substrates, such as PCB substrates, in which electronic apparatuses are arranged.

CITATION LIST

Patent Literature

PTL 1: Japanese Unexamined Patent Application Publication (Kokai) No. 2003-48149
PTL 2: Japanese Unexamined Patent Application Publication (Kokai) No. 2006-255851
PTL 3: Japanese Unexamined Patent Application Publication (Kokai) No. 2009-131946

SUMMARY OF INVENTION

Technical Problem

Circular semiconductive substrates are standardized in dimensions (for example, by SEMI Standards). As for quadrangular substrates including the aforementioned CCL substrates (Copper Clad Laminate substrates), PCB (Printed Circuit Board) substrates, photomask substrates, and display panels, however, there is no standardized dimensions, and such substrates can have various dimensions. In view of efficiency in manufacture of apparatuses, there has recently been a tendency of increasing the dimensions of substrates. Large and heavy substrates easily get warped and deformed, and therefore cannot necessarily be processed with the same technology as conventional processing apparatuses for circular substrates. An object of the present patent application is to provide a top ring for holding a substrate with great dimensions.

Solution to Problem

One embodiment provides a top ring for holding a substrate. The top ring comprises a substrate supporting surface, a retainer member disposed to surround an outer periphery of the substrate supporting surface, and a retainer guiding device configured to guide the retainer member so as to allow the retainer member to be displaced in a direction perpendicular to the substrate supporting surface, and support the retainer member so as to inhibit the retainer member from being displaced in a direction parallel to and away from the substrate supporting surface. The retainer guiding device is disposed in an inner side of the retainer member surrounding the substrate supporting portion.

BRIEF DESCRIPTION OF DRAWINGS

FIG. 8B is a sectional view taken along arrow B—of FIG. 8A.
FIG. 8C is a sectional view taken along arrow C—of FIG. 8A.

DESCRIPTION OF EMBODIMENTS

The following description will explain embodiments of a top ring and a substrate processing apparatus with the top ring according to the invention with reference to the attached drawings. In the attached drawings, identical or similar elements are provided with respective identical or similar reference marks. In the description of each embodiment, explanations overlapping between the identical or similar elements may be omitted. Features mentioned in each embodiment are applicable to the other embodiments as long as there is no inconsistency.

Figure 1:
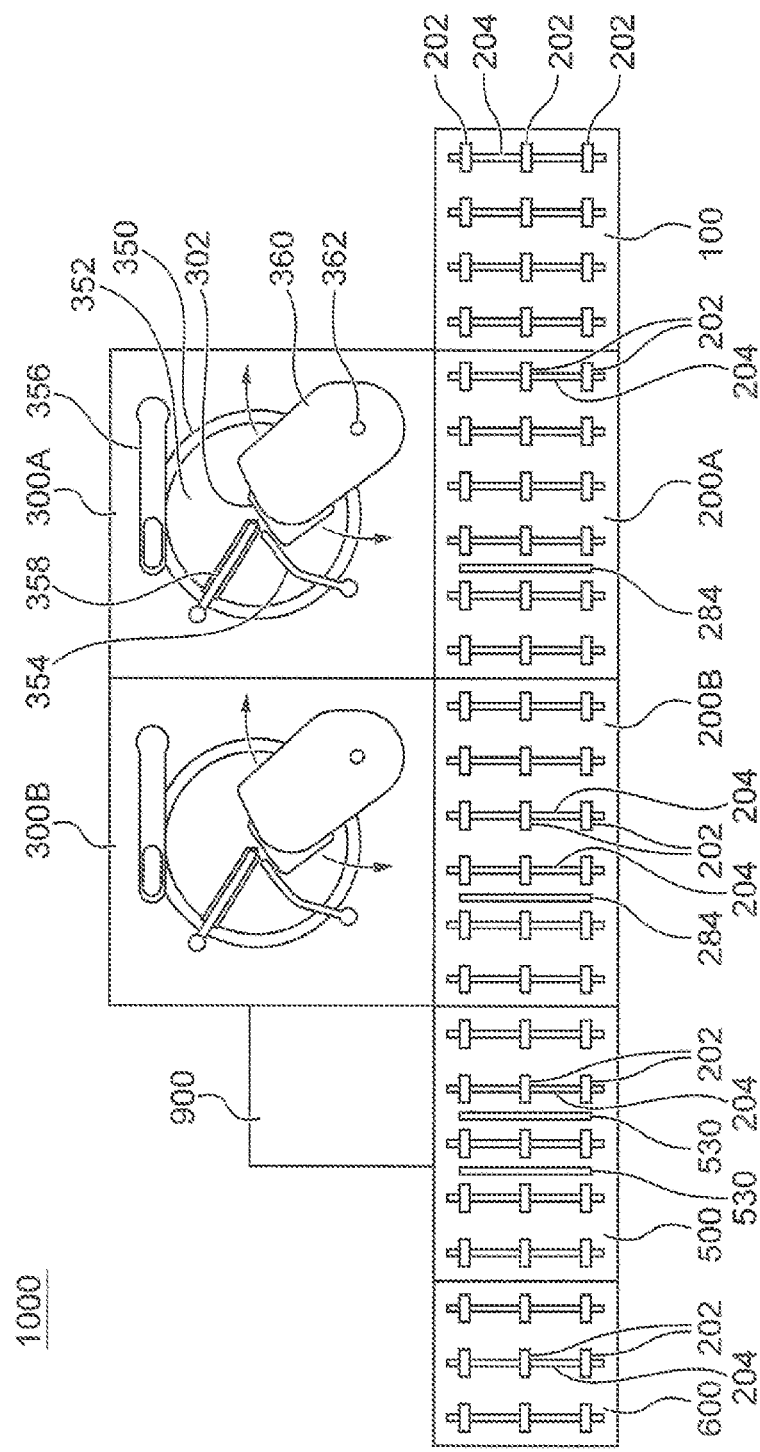
FIG. 1 is a plan view of the entire configuration of a substrate processing apparatus according to one embodiment.

FIG. 1 is a plan view of the entire configuration of a substrate processing apparatus 1000 according to one embodiment. The substrate processing apparatus 1000 shown in FIG. 1 includes a load unit 100, a conveyance unit 200, a polishing unit 300, a drying unit 500, and an unload unit 600. According to the embodiment shown in the figure, the conveyance unit 200 comprises two conveyance units 200A and 200B, and the polishing unit 300 comprises two polishing units 300A and 300B. According to one embodiment, the units may be discretely constructed. The discrete construction of the units makes it possible to easily construct differently configured substrate processing apparatuses by combining an arbitrary number of the units. The substrate processing apparatus 1000 includes a controller 900. Each constituent element of the substrate processing apparatus 1000 is controlled by the controller 900. According to one embodiment, the controller 900 can comprise a general computer including an input/output device, a calculating device, a storage device, etc.

<Load Unit>

Figure 2:
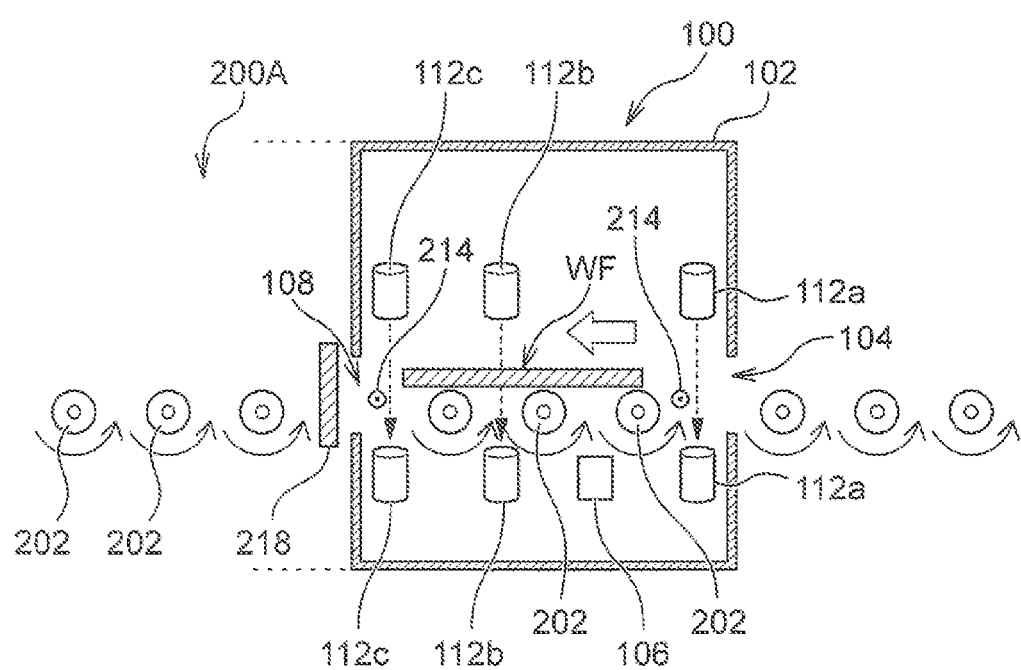
FIG. 2 is a lateral view showing a load unit in a diagram according to one embodiment.

The load unit 100 is a unit for introducing a substrate WF to be polished and washed into the substrate processing apparatus 1000. FIG. 2 is a lateral view showing the load unit 100 in a diagram according to one embodiment. According to one embodiment, the load unit 100 includes a housing 102. The housing 102 has an inlet opening 104 on a side where the housing 102 receives the substrate WF. According to the embodiment shown in FIG. 2, the right-hand side is an inlet side. The load unit 100 receives the substrate WF to be processed from the inlet opening 104. Disposed on an upstream side (right-hand side in FIG. 2) of the load unit 100 is a processing device in which a processing step is carried out. This processing step is carried out prior to the processing of the substrate WF, which is conducted by the substrate processing apparatus 1000 according to the present disclosure. According to the embodiment shown in FIG. 2, the load unit 100 includes an ID reader 106. The ID reader 106 reads out an ID of a substrate that is received through the inlet opening 104. The substrate processing apparatus 1000 applies various kinds of processing to the substrate WF according to the read ID. One embodiment does not necessarily have to include the ID reader 106. In one embodiment, the load unit 100 is configured in compliance with SMEMA (Surface Mount Equipment Manufactures Association) Mechanical Equipment Interface Standard (IPC-SMEMA-9851).

According to the embodiment shown in FIG. 2, the load unit 100 includes a plurality of conveyance rollers 202 for conveying the substrate WF. The substrate WF on the conveyance rollers 202 can be conveyed in a predetermined direction (left-hand direction in FIG. 2) by rotating the conveyance rollers 202 due to a similar configuration to a rotation mechanism (in which the conveyance rollers 202 are attached to roller shafts 204 and rotated through a gear 206 by a motor 208) as described in <Conveyance Unit> discussed later. According to the embodiment shown in the figure, the housing 102 of the load unit 100 has an outlet opening 108 for the substrate WF. The load unit 100 includes a sensor 112 for detecting the presence/absence of the substrate WF in a predetermined position on the conveyance rollers 202. The sensor 112 may be of any form and may be an optical sensor, for example. According to the embodiment shown in FIG. 2, the sensor 112 comprises three sensors 112 located in the housing 102. The sensors 112 include a sensor 112a disposed near the inlet opening 104, a sensor 112b disposed near a center of the load unit 100, and a sensor 112c disposed near the outlet opening 108. According to one embodiment, the operation of the load unit 100 can be controlled according to the detection of the substrate WF by the sensors 112. For example, the conveyance rollers 202 in the load unit 100 may be configured to start rotating or be changed in rotating speed when the sensor 112a located near the inlet opening 104 detects the presence of the substrate WF. An inlet shutter 218 of the conveyance unit 200A that is a subsequent unit may be configured to open when the sensor 112c located near the outlet opening 108 detects the presence of the substrate WF.

According to the embodiment shown in the figure, a conveyance mechanism of the load unit 100 includes the plurality of conveyance rollers 202 and the plurality of roller shafts 204 to which the conveyance rollers 202 are attached. According to the embodiment shown in FIG. 1, three conveyance rollers 202 are attached to each of the roller shafts 204. The substrate WF is disposed on the conveyance rollers 202 and conveyed by rotation of the conveyance rollers 202. The conveyance rollers 202 may be attached to the roller shafts 204 at freely-selected positions on the roller shafts 204 as long as the substrate WF can be conveyed in a stable manner. However, considering that the conveyance rollers 202 contact the substrate WF, the conveyance rollers 202 should be arranged to contact such an area of the substrate WF to be processed that the contact does not cause any problem. According to one embodiment, the conveyance rollers 202 of the load unit 100 can be made of conductive polymer. According to one embodiment, the conveyance rollers 202 are electrically grounded through the roller shafts 204 or the like. This is to prevent the substrate WF from being electrified and damaged. According to one embodiment, the load unit 100 may be provided with an ionizer (not shown) to prevent the electrification of the substrate WF.

As shown in FIG. 2, the load unit 100 is provided with auxiliary rollers 214 disposed near the inlet opening 104 and the outlet opening 108. The auxiliary rollers 214 are disposed approximately on a level with the conveyance rollers 202. The auxiliary rollers 214 support the substrate WF so that the substrate WF does not fall between the units while being conveyed. The auxiliary rollers 214 are not connected to a power source and configured to be freely rotatable.

<Conveyance Unit>

Figure 3:
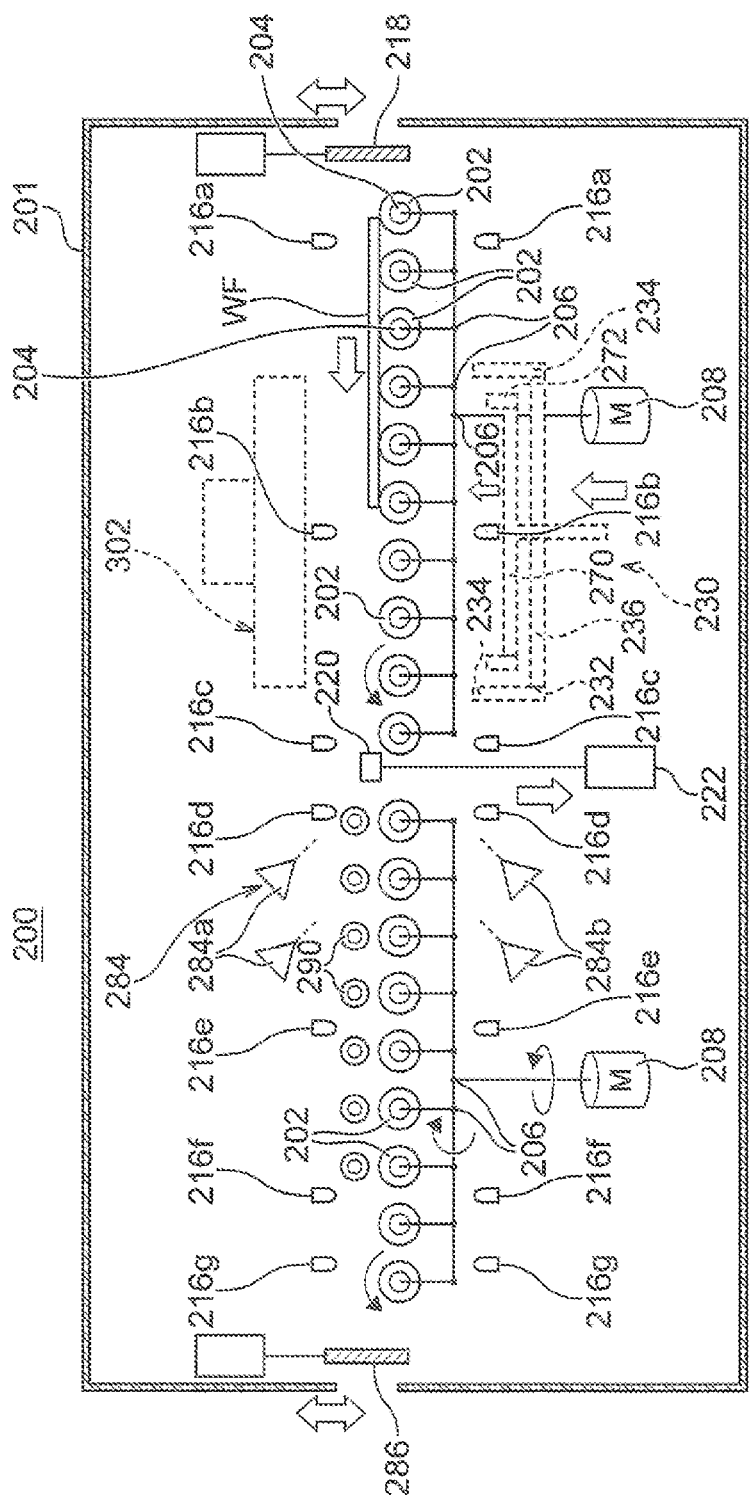
FIG. 3 is a lateral view showing a conveyance unit in a diagram according to one embodiment.

FIG. 3 is a lateral view showing the conveyance unit 200 in a diagram according to one embodiment. The substrate processing apparatus 1000 shown in FIG. 1 includes the two conveyance units 200A and 200B. As the two conveyance units 200A and 200B may have an identical configuration, the units 200A and 200B will be collectively described as the conveyance unit 200.

The conveyance unit 200 shown in the figure includes the plurality of conveyance rollers 202 for conveying the substrate WF. The substrate WF on the conveyance rollers 202 can be conveyed in the predetermined direction by rotating the conveyance rollers 202. The conveyance rollers 202 of the conveyance unit 200 may be made of either conductive or non-conductive polymer. The conveyance rollers 202 are attached to the roller shafts 204 and driven by the motor 208 through the gear 206. According to one embodiment, the motor 208 may be a servomotor. The rotating speed of the roller shafts 204 and the conveyance rollers 202, that is, conveyance speed of the substrate WF can be controlled by using the servomotor. According to one embodiment, the gear 206 may be a magnetic gear. The magnetic gear is a non-contact power transmission mechanism. Unlike a contact-type gear, the magnetic gear does not generate fine particles from abrasion and also eliminates the necessity of maintenance, such as oiling. The conveyance unit 200 shown in the figure includes a sensor 216 for detecting the presence/absence of the substrate WF located at the predetermined position on the conveyance rollers 202. The sensor 216 may be of any form and may be an optical sensor, for example. According to the embodiment shown in FIG. 3, the sensor 216 comprises seven sensors (216a to 216g) provided to the conveyance unit 200. According to one embodiment, the operation of the conveyance unit 200 can be controlled according to the detection of the substrate WF by the sensors 216a to 216g. As shown in FIG. 3, the conveyance unit 200 includes the inlet shutter 218 that is openable/closable to receive the substrate WF into the conveyance unit 200.

As shown in FIG. 3, the conveyance unit 200 includes a stopper 220. The stopper 220 is connected to a stopper transfer mechanism 222. The stopper 220 is allowed to enter into a conveyance route of the substrate WF traveling on the conveyance rollers 202. When the stopper 220 is located on the conveyance route of the substrate WF, a lateral surface of the substrate WF traveling on the conveyance rollers 202 comes into contact with the stopper 220 to stop the traveling substrate WF at a position of the stopper 220. When the stopper 220 is located at a position retreated from the conveyance route of the substrate WF, the substrate WF can travel on the conveyance rollers 202. The stop position where the substrate WF is stopped by the stopper 220 is a position where a pusher 230 described later can receive the substrate WF on the conveyance rollers 202 (substrate delivery position).

As shown in FIG. 3, the conveyance unit 200 includes the pusher 230. The pusher 230 is configured to be capable of lifting the substrate WF on the plurality of conveyance rollers 202 so that the substrate WF is separated away from the plurality of conveyance rollers 202. The pusher 230 is further configured to be capable of delivering the substrate WF held by the pusher 230 to the conveyance rollers 202 of the conveyance unit 200.

The pusher 230 includes a first stage 232 and a second stage 270. The first stage 232 is a stage for supporting the retainer member 3 of a top ring 302 described later when the substrate WF is delivered from the pusher 230 to the top ring 302. The first stage 232 includes a plurality of supporting poles 234 for supporting the retainer member 3 of the top ring 302. The second stage 270 is a stage for receiving the substrate WF on the conveyance rollers 202. The second stage 270 includes a plurality of supporting poles 272 for receiving the substrate WF on the conveyance rollers 202. The first stage 232 and the second stage 270 are movable in a height direction by using a first elevating mechanism. The second stage 270 is further movable in the height direction relative to the first stage 232 by using a second elevating mechanism. When the first stage 232 and the second stage 270 are elevated by the first and second elevating mechanisms, a part of the supporting poles 234 of the first stage 232 and a part of the supporting poles 272 of the second stage 270 pass between the conveyance rollers 202 and the roller shafts 204 and come above the conveyance rollers 202. The substrate WF conveyed on the conveyance rollers 202 is stopped at the substrate delivery position by the stopper 220. The first stage 232 and the second stage 270 are then elevated by the first elevating mechanism to lift the substrate WF on the conveyance rollers 202 by using the supporting poles 272 of the second stage 270. Subsequently, the second stage 270 holding the substrate WF is elevated by the second elevating mechanism while the retainer member 3 of the top ring 302 is supported by the supporting poles 234 of the first stage 232. The substrate WF on the second stage 270 is received by the top ring 302 and held by vacuum suction.

According to one embodiment, the conveyance unit 200 includes a washing section. As shown in FIG. 3, the washing section has a washing nozzle 284. The washing nozzle 284 comprises an upper washing nozzle 284a disposed above the conveyance rollers 202 and a lower washing nozzle 284b disposed below the conveyance rollers 202. The upper washing nozzle 284a and the lower washing nozzle 284b are connected to a feeding source of washing liquid, not shown. The upper washing nozzle 284a is configured to feed the washing liquid to an upper surface of the substrate WF conveyed on the conveyance rollers 202. The lower washing nozzle 284b is configured to feed the washing liquid to a lower surface of the substrate WF conveyed on the conveyance rollers 202. The upper washing nozzle 284a and the lower washing nozzle 284b have width that is approximately the same as or larger than width of the substrate WF conveyed on the conveyance rollers 202. The upper washing nozzle 284a and the lower washing nozzle 284b are configured so that all surfaces of the substrate WF are washed by the substrate WF being conveyed on the conveyance rollers 202. As shown in FIG. 3, the washing section is located on a downstream side of the substrate delivery position of the pusher 230 of the conveyance unit 200.

<Polishing Unit>

Figure 4:
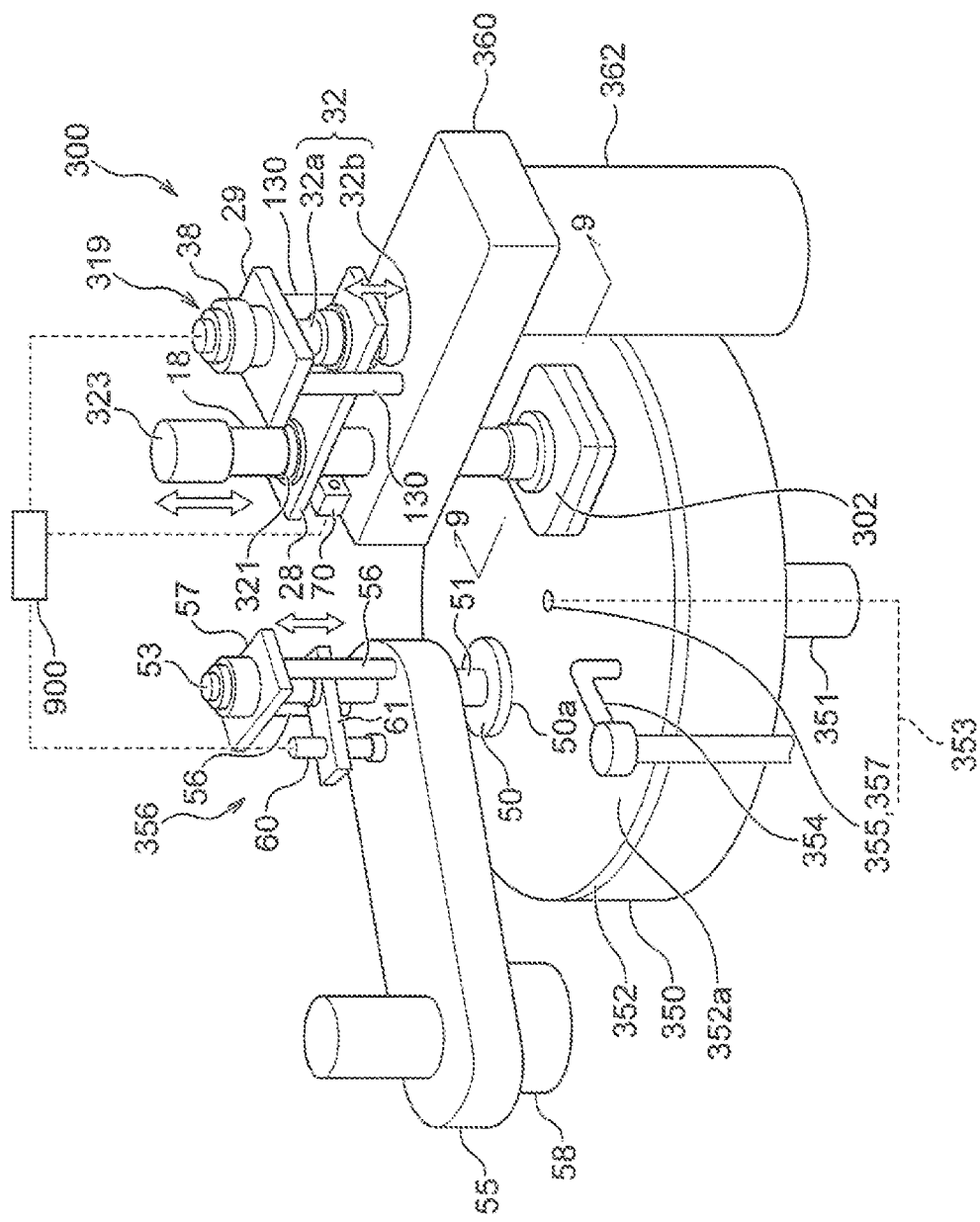
FIG. 4 is a schematic perspective view of a configuration of a polishing unit according to one embodiment.

FIG. 4 is a schematic perspective view showing a configuration of the polishing unit 300 according to one embodiment. The substrate processing apparatus 1000 shown in FIG. 1 includes the two polishing units 300A and 300B. As the two polishing units 300A and 300B may have an identical configuration, the units 300A and 300B will be collectively described as the conveyance unit 300.

As shown in FIG. 4, the polishing unit 300 includes a polishing table 350 and the top ring 302 forming a polishing head which holds and presses the substrate to be polished against a polishing surface of the polishing table 350. The polishing table 350 is coupled through a table shaft 351 to a polishing-table rotating motor (not shown) which is disposed below the polishing table 350. The polishing table 350 is rotatable around the table shaft 351. Attached to an upper surface of the polishing table 350 is a polishing pad 352. The polishing pad 352 has a surface 352a forming the polishing surface which polishes the substrate. According to one embodiment, the polishing pad 352 may be attached to the polishing table 350 with a layer intervening therebetween, which is for facilitating the detachment of the polishing pad 352 from the polishing table 350. Such a layer is, for example, a silicone layer, a fluorine-based resin layer or the like. For example, the one disclosed in the Japanese Unexamined Patent Application Publication (Kokai) No. 2014-176950 may be used.

A polishing liquid feeding nozzle 354 is placed above the polishing table 350. The polishing liquid feeding nozzle 354 is used to feed polishing liquid onto the polishing pad 352 on the polishing table 350. As shown in FIG. 4, the polishing table 350 and the table shaft 351 are provided with a passage 353 for feeding the polishing liquid. The passage 353 is in communication with an opening portion 355 formed in a surface of the polishing table 350. A through-hole 357 is formed in the polishing pad 352 at a position coinciding with the opening portion 355 of the polishing table 350. The polishing liquid passing through the passage 353 is fed from the opening portion 355 of the polishing table 350 and the through-hole 357 of the polishing pad 352 to a surface of the polishing pad 352. The polishing table 350 and the polishing pad 352 may have one or more opening portions 355 and through-holes 357, respectively. The opening portion 355 of the polishing table 350 and the through-hole 357 of the polishing pad 352 may be located at freely-selected positions. According to one embodiment, the opening portion 355 of the polishing table 350 and the through-hole 357 of the polishing pad 352 are disposed near a center of the polishing table 350.

Although not shown in FIG. 4, according to one embodiment, the polishing unit 300 includes an atomizer 358 for injecting liquid or a mixed fluid of liquid and gas toward the polishing pad 352 (see FIG. 1). The liquid injected from the atomizer 358 is, for example, pure water. The gas is, for example, a nitrogen gas.

The top ring 302 is connected to a top ring shaft 18. The top ring shaft 18 is vertically moved relative to a swing arm 360 by a vertical motion mechanism 319. The entire top ring 302 are vertically moved by the vertical motion of the top ring shaft 18 to be positioned relative to the swing arm 360. The top ring shaft 18 is rotated by activating a top-ring rotating motor, not shown. The rotation of the top ring shaft 18 causes the top ring 302 to rotate around the top ring shaft 18. The top ring shaft 18 has an upper end attached with a rotary joint 323.

There is a variety of polishing pads available in the market. For example, there are SUBA800 ("SUBA" is a registered trademark), IC-1000 and IC-1000/SUBA400 (double layer cloth) manufactured by Nitta Haas Incorporated, and Surfin xxx-5, Surfin 000, etc. ("surfin" is a registered trademark) manufactured by Fujimi Incorporated. The SUBA800, the Surfin xxx-5 and the Surfin 000 are non-woven cloths made by bonding fibers together using urethane resin. The IC-1000 is a hard foamed polyurethane (single layer). The foamed polyurethane is porous (of a porous form) and has a large number of micro indents or pores in a surface thereof.

The top ring 302 is capable of holding a quadrangular substrate in a lower surface thereof. The swing arm 360 is turnable around a supporting shaft 362. The turning of the swing arm 360 makes the top ring 302 movable between the substrate delivery position of the conveyance unit 200 and a position above the polishing table 350. The top ring 302 is lowered by lowering the top ring shaft 18, to thereby press the substrate against the surface (polishing surface) 352a of the polishing pad 352. At this point of time, the top ring 302 and the polishing table 350 are separately rotated, and the polishing liquid is thus fed onto the polishing pad 352 from the polishing liquid feeding nozzle 354 placed above the polishing table 350 and/or the opening portion 355 formed in the polishing table 350. As described above, the surface of the substrate can be polished while the substrate is pressed against the polishing surface 352a of the polishing pad 352. The arm 360 may be fixed or swung so that the top ring 302 passes through a center of the polishing pad 352 (so that the top ring 302 covers the through-hole 357 of the polishing pad 352) during the polishing of the substrate WF.

The vertical motion mechanism 319 configured to vertically move the top ring shaft 18 and the top ring 302 includes a bridge 28 which rotatably supports the top ring shaft 18 through a bearing 321, a ball screw 32 attached to the bridge 28, a support rack 29 supported by a supporting pole 130, and an AC servomotor 38 disposed on the support rack 29.

The support rack 29 supporting the servomotor 38 is fixed to the swing arm 360 through the supporting pole 130.

The ball screw 32 includes a screw shaft 32a coupled to the servomotor 38 and a nut 32b, into which the screw shaft 32a is screwed. The top ring shaft 18 is configured to vertically move in an integral manner with the bridge 28. When the servomotor 38 is driven, therefore, the bridge 28 vertically moves through the ball screw 32, which causes the top ring shaft 18 and the top ring 302 to make vertical motions. The polishing unit 300 includes a distance measuring sensor 70 functioning as a position detector for detecting distance to a lower surface of the bridge 28, that is, a position of the bridge 28. The detection of the position of the bridge 28 by the distance measuring sensor 70 makes it possible to detect a position of the top ring 302. The distance measuring sensor 70 forms the vertical motion mechanism 319 together with the ball screw 32 and the servomotor 38. The distance measuring sensor 70 may be a laser sensor, an ultrasonic sensor, an overcurrent sensor or a linear scale sensor. The devices in the polishing unit, including the distance measuring sensor 70 and the servomotor 38, are controlled by the controller 900.

The polishing unit 300 according to one embodiment includes a dressing unit 356 which dresses the polishing surface 352a of the polishing pad 352. The dressing unit 356 includes a dresser 50 which comes into sliding contact with the polishing surface 352a, a dresser shaft 51, to which the dresser 50 is coupled, an air cylinder 53 disposed at an upper end of the dresser shaft 51, and a swing arm 55 which rotatably supports the dresser shaft 51. A lower part of the dresser 50 is formed of a dressing member 50a. The dressing member 50a has a lower surface, to which needle-like diamond particles adhere. The air cylinder 53 is disposed on a support rack 57 supported by supporting poles 56. The support poles 56 are fixed to the swing arm 55.

The swing arm 55 is driven by a motor, not shown, and configured to turn around a supporting shaft 58. The dresser shaft 51 is rotated by driving a motor, not shown. The rotation of the dresser shaft 51 rotates the dresser 50 around the dresser shaft 51. The air cylinder 53 moves the dresser 50 vertically through the dresser shaft 51 and thus presses the dresser 50 against the polishing surface 352a of the polishing pad 352 with predetermined pressure.

The dressing of the polishing surface 352a of the polishing pad 352 is carried out in the following manner. The dresser 50 is pressed against the polishing surface 352a by the air cylinder 53. At the same time, pure water is fed onto the polishing surface 352a from a pure water feeding nozzle, not shown. In this state, the dresser 50 is rotated around the dresser shaft 51 to bring the lower surface (diamond particles) of the dressing member 50a into sliding contact with the polishing surface 352a. In this manner, the polishing pad 352 is ground by the dresser 50, thus dressing the polishing surface 352a.

The polishing device according to the present embodiment measures abrasion loss of the polishing pad 352 using the dresser 50. In other words, the dressing unit 356 includes a displacement sensor 60 which measures displacement of the dresser 50. The displacement sensor 60 forms abrasion loss detecting means which detects the abrasion loss of the polishing pad 352. The displacement sensor 60 is placed on an upper surface of the swing arm 55. Fixed to the dresser shaft 51 is a target plate 61. The target plate 61 moves vertically along with the vertical motion of the dresser 50. The displacement sensor 60 is disposed so as to extend through the target plate 61. The displacement sensor 60 measures the displacement of the target plate 61 to measure the displacement of the dresser 50. The displacement sensor 60 may be any type of sensor, such as a linear scale sensor, a laser sensor, an ultrasound sensor, and an overcurrent sensor.

According to the present embodiment, the abrasion loss of the polishing pad 352 is measured in the following manner. First, the air cylinder 53 is driven to bring the dresser 50 into contact with the polishing surface 352a of the polishing pad 352 already subjected to initial dressing. In this state, the displacement sensor 60 detects an initial position (initial value of the level) of the dresser 50 and stores the initial position (initial value of the level) in the controller 900. After the polishing processing of one or more substrates is finished, the dresser 50 is brought into contact with the polishing surface 352a again. In this state, the position of the dresser 50 is measured. The position of the dresser 50 is displaced downward according to the abrasion loss of the polishing pad 352. Therefore, the controller 900 can obtain the abrasion loss of the polishing pad 352 by obtaining difference between the initial position and a position of the dresser 50 after the polishing is finished. The abrasion loss of the polishing pad 352 is obtained on the basis of the position of the dresser 50 in the above-described manner.

According to one embodiment, when the substrate is polished using the polishing unit 300 shown in FIG. 4, the polishing pad 352 is changed in thickness due to dressing, replacement of the polishing pad 352, etc. According to the top ring 302 in which an elastic membrane 4 (membrane) mentioned later is expanded to apply pressure to the substrate, a contact range and surface pressure distribution of the elastic membrane in an outer periphery of the substrate are changed by distance between the elastic membrane 4 and the substrate WF. In such a case, in order to prevent the surface pressure distribution of the substrate from changing as the polishing proceeds, it is necessary to maintain a constant distance between the top ring 302 and the surface (polishing surface) of the polishing pad 352 during the polishing. In order to maintain the constant distance between the top ring 302 and the surface of the polishing pad 352, it is necessary to, for example, detect the level (position) of the surface of the polishing pad 352 and adjust a lowering position of the top ring 302 after the polishing pad 352 is replaced and subjected to initial dressing (described later) by the dresser. Hereinafter, the step of detecting the level (position) of the surface of the polishing pad 352 will be referred to as pad search using the top ring.

The pad search using the top ring includes detection of the level position of the top ring 302 at the point of time when the lower surface of the top ring 302 (or the lower surface of the substrate held by the top ring 302) contacts the surface (polishing surface) of the polishing pad 352. More specifically, when the pad search using the top ring is conducted, the servomotor 38 is driven to lower the top ring 302 while integrating the number of rotations using an encoder. When the lower surface of the top ring 302 contacts the surface of the polishing pad 352, load on the servomotor 38 is increased, which increases electric current that flows through the servomotor 38. In short, the electric current flowing through the servomotor 38 is detected by a current detector of the controller 900, and when the electric current is increased, it is determined that the lower surface of the top ring 302 contacts the surface of the polishing pad 352. When it is determined that the lower surface of the top ring 302 contacts the surface of the polishing pad 352, the controller 900 calculates a lowering distance (position) of the top ring 302 from an integrated value obtained by the encoder of the servomotor 38, and stores the lowering distance. The controller 900 obtains the level of the surface of the polishing pad 352 from the lowering distance of the top ring 302 and calculates an installation position of the top ring 302 at the time of the polishing from the level of the surface of the polishing pad 352.

In this case, the substrate used for the pad search using the top ring is preferably a dummy substrate for pad search, instead of a substrate to be processed by the substrate processing apparatus 1000. There are cases where the pad search may be conducted using the substrate to be processed by the substrate processing apparatus 1000. However, the use of the dummy substrate for pad search eliminates the possibility that the substrate to be processed is damaged by the pad search.

As the servomotor 38, it is preferable to use a motor that is variable in maximum current of the motor. The use of such a servomotor makes it possible to prevent the substrate (dummy substrate), the top ring 302, the polishing pad 352 and the like from being applied with an extremely large load when the lower surface of the top ring 302 or the surface of the substrate (dummy substrate) held by the top ring 302 contacts the polishing pad 352, for example, by previously setting a maximum current value of the motor within a range from approximately 25 percent to approximately 30 percent as an example at the time of the pad search using the top ring. In this case, it is possible to predict, to a certain level, when the top ring 302 contacts the polishing pad 352 on the basis of lowering time or lowering distance of the top ring 302. It is therefore preferable to decrease the maximum current value of the servomotor 38 before the top ring 302 contacts the polishing pad 352. This makes the lowering operation quick and secure.

Figure 5:
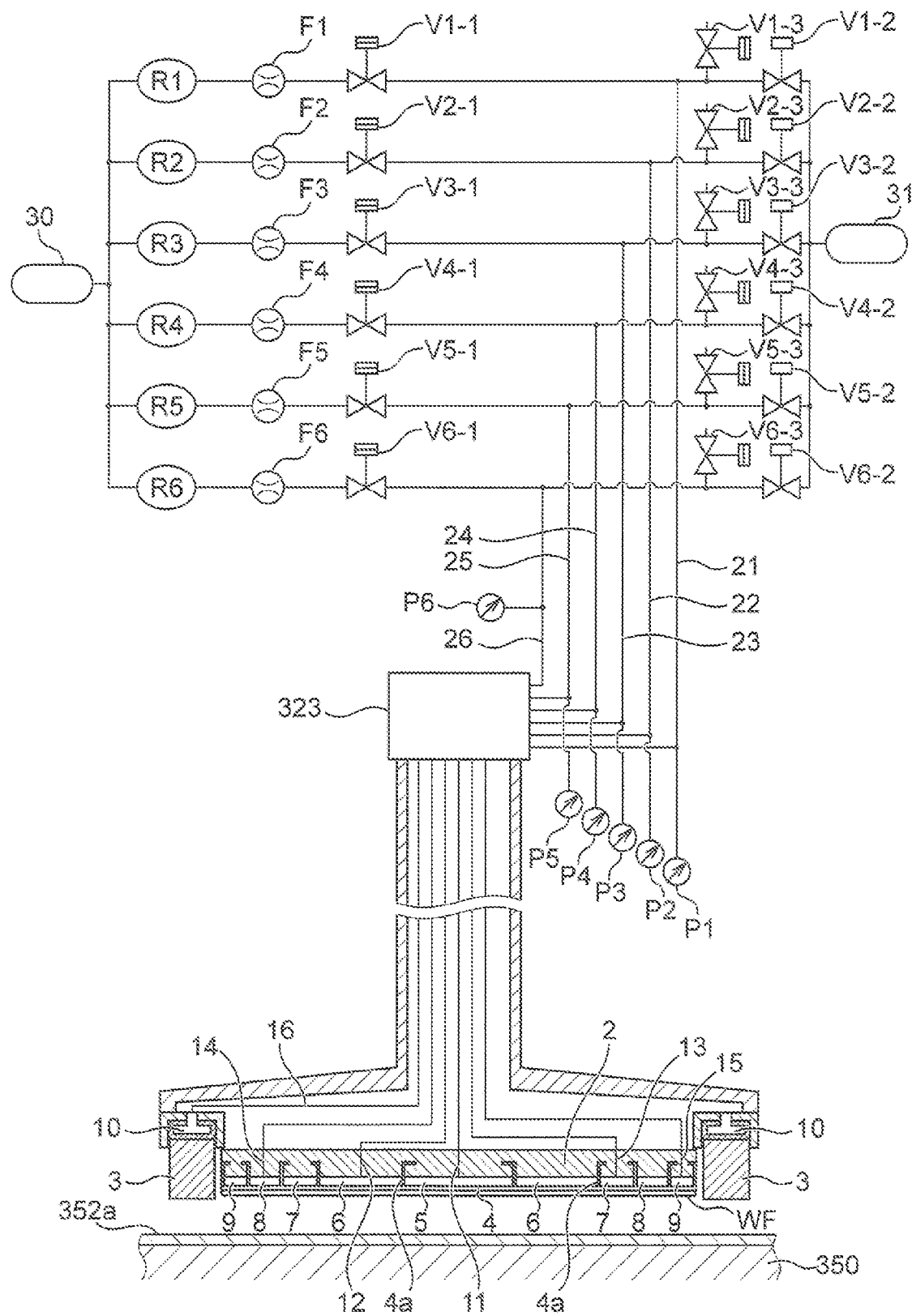
FIG. 5 is a schematic sectional view of a top ring which holds a substrate as a workpiece to be polished and presses the substrate against a polishing surface on a polishing pad according to one embodiment.
Figure 6:
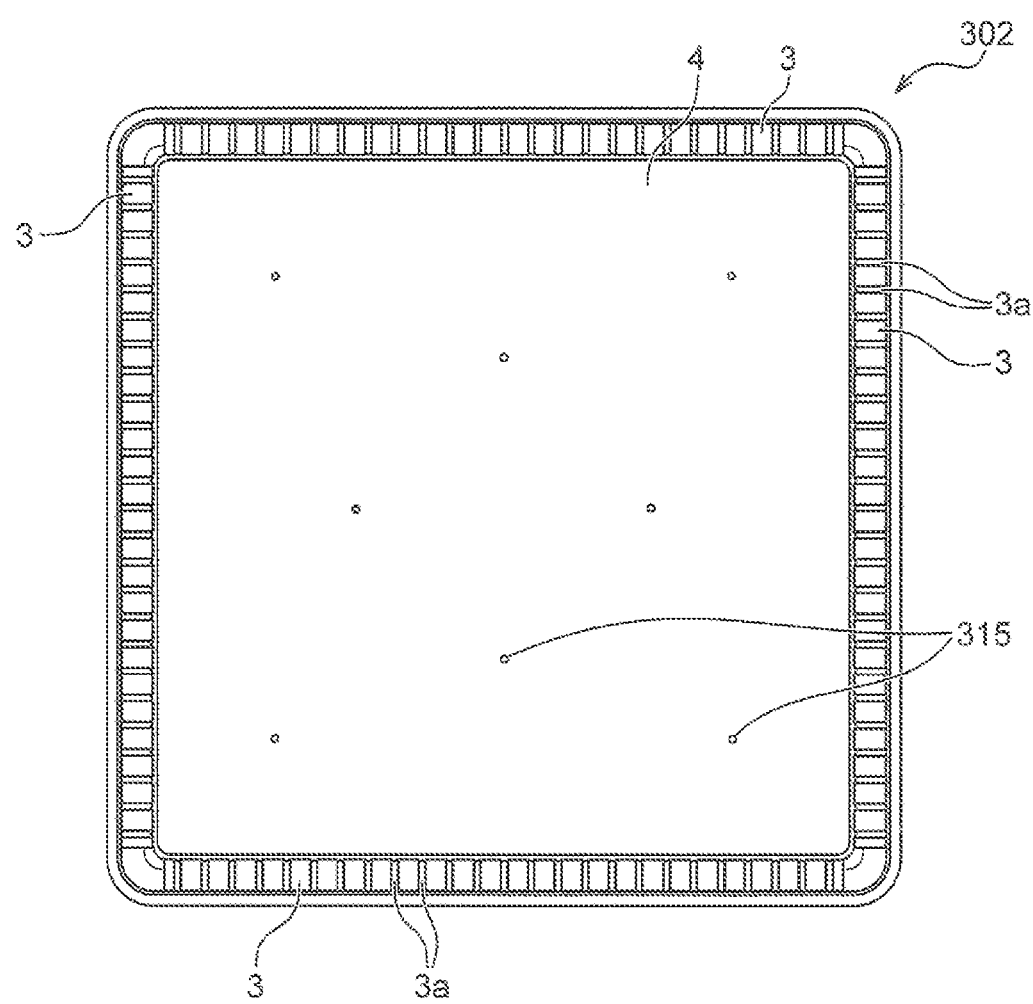
FIG. 6 shows the top ring as viewed from a polishing table side according to one embodiment.

The following description will explain the top ring 302 in the polishing unit 300 according to one embodiment. FIG. 5 is a schematic sectional view of the top ring 302 which holds the substrate as a workpiece to be polished and presses the substrate against the polishing surface on the polishing pad according to one embodiment. FIG. 5 schematically shows only major constituent elements which form the top ring 302. FIG. 6 shows the top ring 302 as viewed from the polishing table 350 side according to one embodiment.

Figure 7:
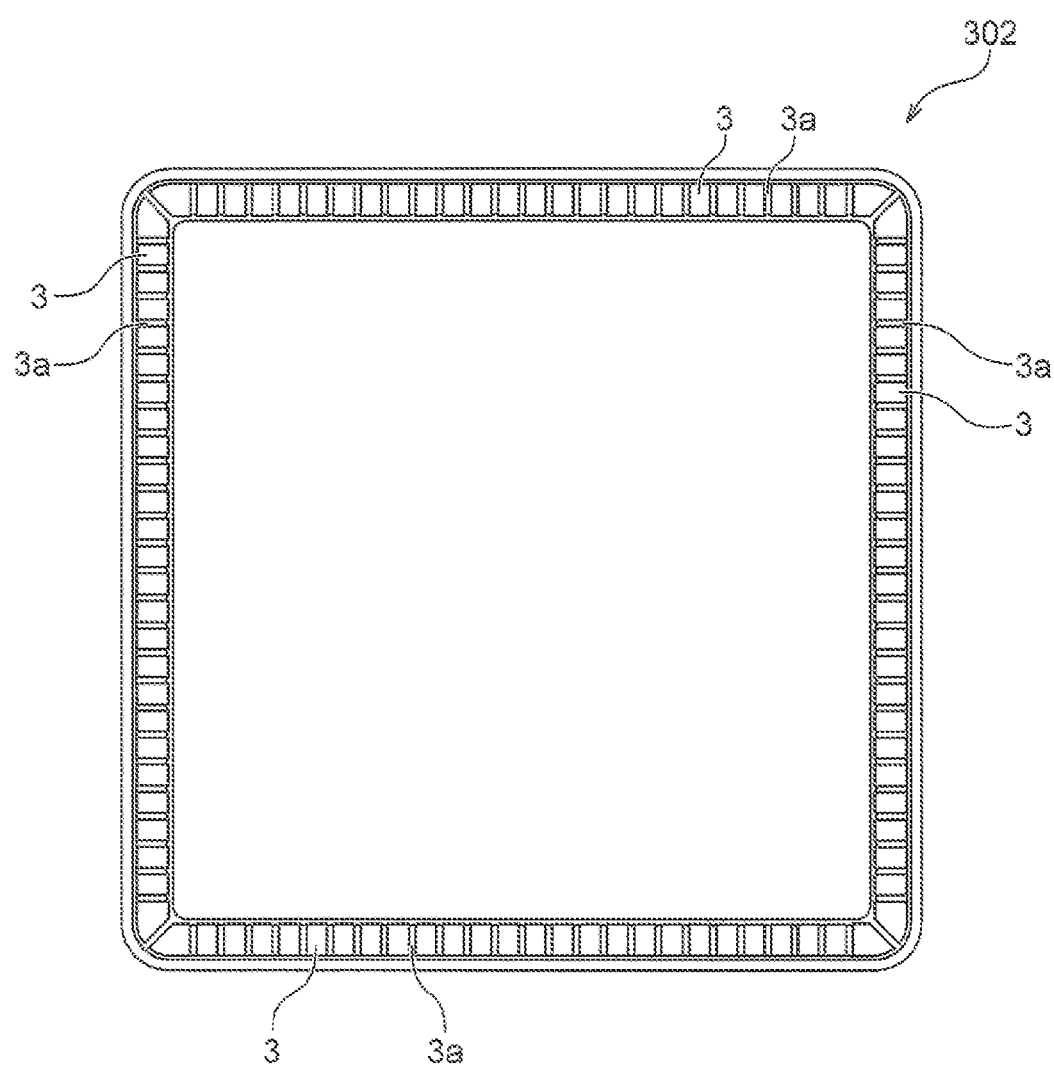
FIG. 7 shows a form of a retainer member according to one embodiment.

As shown in FIG. 5, the top ring 302 includes a top ring body 2 which presses the substrate WF against the polishing surface 352a, and the retainer member 3 which directly presses the polishing surface 352a. The top ring body 2 comprises a flat member having a substantially quadrangular shape. The retainer member 3 is attached to an outer peripheral portion of the top ring body 2. According to one embodiment, the retainer member 3 is a plate-like member having an elongated rectangular shape as shown in FIG. 6. According to the embodiment shown in FIG. 6, the retainer member 3 is formed by placing four plate-like members on the outer side of sides of the quadrangular top ring body 2. According to one embodiment, as shown in FIG. 6, the retainer member 3 includes a plurality of grooves 3a. The retainer member 3 shown in FIG. 6 includes the grooves 3a extending from an inner side to an outer side of the top ring 302. According to the embodiment shown in FIG. 6, each corner of the top ring body 2 includes an area in which the retainer member 3 is absent. FIG. 7 shows a form of the retainer member 3 according to one embodiment. The retainer member 3 shown in FIG. 7 has a form in which end portions of the elongated retainer member 3 of FIG. 6 each has a fan-like shape. Therefore, if four retainer members 3 are jointed together as shown in FIG. 7, substantially the entire top ring body 2 including the corners thereof can be surrounded by the retainer members 3. The top ring body 2 is made of resin, such as engineering plastic (PEEK, for example). The elastic membrane (membrane) 4 which comes into contact with a rear surface of the substrate is attached to a lower surface of the top ring body 2. According to one embodiment, the elastic membrane (membrane) 4 is made of rubber material with high strength and durability. Such rubber materials include an ethylene-propylene rubber (EPDM), a polyurethane rubber, a silicone rubber, etc. According to one embodiment, the elastic membrane (membrane) 4 can be made of rubber material using a mold.

Figure 8A:
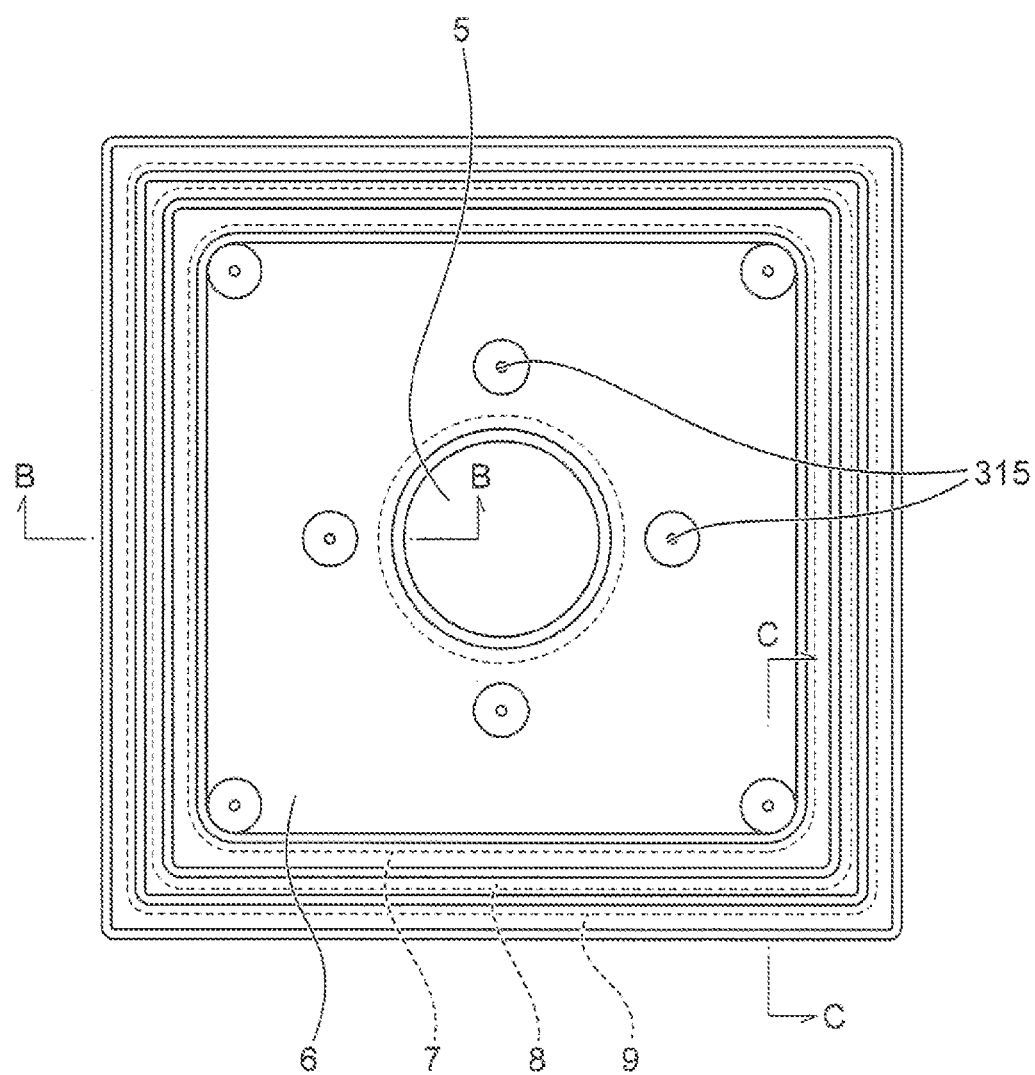
FIG. 8A is a top view showing a structure of an elastic membrane (membrane) according to one embodiment.

The elastic membrane (membrane) 4 includes a plurality of concentric partition walls 4a. The partition walls 4a define a circular center chamber 5, a quadrangular ring-like ripple chamber 6 which encloses the center chamber 5, a quadrangular ring-like intermediate chamber 7 which encloses the ripple chamber 6, a quadrangular ring-like outer chamber 8 which encloses the intermediate chamber 7, and a quadrangular ring-like edge chamber 9 which encloses the outer chamber 8, between an upper surface of the elastic membrane 4 and the lower surface of the top ring body 2. In other words, the center chamber 5 is formed in a center portion of the top ring body 2. The ripple chamber 6, the intermediate chamber 7, the outer chamber 8, and the edge chamber 9 are concentrically arranged from a center toward an outer periphery in the order mentioned above. FIG. 8A is a top view showing a structure of the elastic membrane (membrane) 4 according to one embodiment. FIG. 8B is a sectional view taken along arrow B-B of FIG. 8A. FIG. 8C is a sectional view taken along arrow C-C of FIG. 8A. As shown in FIG. 5, a passage 11 in communication with the center chamber 5, a passage 12 in communication with the ripple chamber 6, a passage 13 in communication with the intermediate chamber 7, a passage 14 in communication with the outer chamber 8, and a passage 15 in communication with the edge chamber 9 are formed within the top ring body 2. The passage 11 in communication with the center chamber 5, the passage 12 in communication with the ripple chamber 6, the passage 13 in communication with the intermediate chamber 7, the passage 14 in communication with the outer chamber 8, and the passage 15 in communication with the edge chamber 9 are connected to passages 21, 22, 23, 24 and 25, respectively, through a rotary joint 323. The passages 21, 22, 23, 24 and 25 are connected to a pressure adjuster 30 via valves V1-1, V2-1, V3-1, V4-1 and V5-1, respectively, and pressure regulators R1, R2, R3, R4 and R5, respectively. The passages 21, 22, 23, 24 and 25 are further connected to a vacuum source 31 via valves V1-2, V2-2, V3-2, V4-2 and V5-2, respectively, and are allowed to come into communication with the atmosphere via valves V1-3, V2-3, V3-3, V4-3 and V5-3, respectively. A valve V6-2 and pipes in the vicinity of the valve V6-2 may be omitted if a retainer portion 380 later described has a structure in which vacuuming is impossible to be carried out.

As shown in FIGS. 6, 8A, 8B and 8C, a plurality of vacuum apertures 315 are formed in the elastic membrane 4. The vacuum apertures 315 are in communication with the ripple chamber 6 and enables the top ring 302 to vacuum-hold the substrate WF. According to one embodiment, as shown in FIGS. 6 and 8A, the vacuum apertures 315 comprises eight vacuum apertures 315. The vacuum apertures 315 are in communication with a passage, not shown, and connected to the vacuum source. The substrate WF can be vacuumed onto the elastic membrane 4 of the top ring 302 using the vacuum apertures 315.

Formed above the retainer member 3 is a retainer member pressurization chamber 10 which is made of an elastic membrane. The retainer member pressurization chamber 10 is connected to a passage 26 through a passage 16 formed within the top ring body 2 and the rotary joint 323. The passage 26 is connected to the pressure adjuster 30 via a valve V6-1 and a pressure regulator R6. The passage 26 is connected to the vacuum source 31 via a valve V6-2 and allowed to come into communication with the atmosphere via a valve V6-3. The pressure regulators R1, R2, R3, R4, R5 and R6 have a pressure adjusting function which adjusts pressure of pressure fluid that is fed from the pressure adjuster 30 into the center chamber 5, the ripple chamber 6, the intermediate chamber 7, the outer chamber 8, the edge chamber 9, and the retainer member pressurization chamber 10, respectively. The pressure regulators R1, R2, R3, R4, R5 and R6 and the valves V1-1 to V1-3, V2-1 to V2-3, V3-1 to V3-3, V4-1 to V4-3, V5-1 to V5-3, and V6-1 to V6-3 are connected to the controller 900 (see FIG. 1) to be controlled in activation. Pressure sensors P1, P2, P3, P4, P5 and P6, and flow rate sensors F1, F2, F3, F4, F5 and F6 are placed in the passages 21, 22, 23, 24, 25 and 26, respectively.

According to the top ring 302 configured as shown in FIG. 5, the center chamber 5 is formed in the center portion of the top ring body 2, and the ripple chamber 6, the intermediate chamber 7, the outer chamber 8, and the edge chamber 9 are concentrically arranged from the center toward the outer periphery in the order mentioned above as already described. The pressure of the fluid which is fed to the center chamber 5, the ripple chamber 6, the intermediate chamber 7, the outer chamber 8, the edge chamber 9, and the retainer member pressurization chamber 10 can be individually adjusted using the pressure adjuster 30 and the pressure regulators R1, R2, R3, R4, R5 and R6. The foregoing structure makes it possible to adjust the pressing force which presses the substrate WF against the polishing pad 352 with respect to each area of the substrate WF, and furthermore makes it possible to adjust the pressing force, with which the retainer member 3 presses the polishing pad 352.

Figure 19:
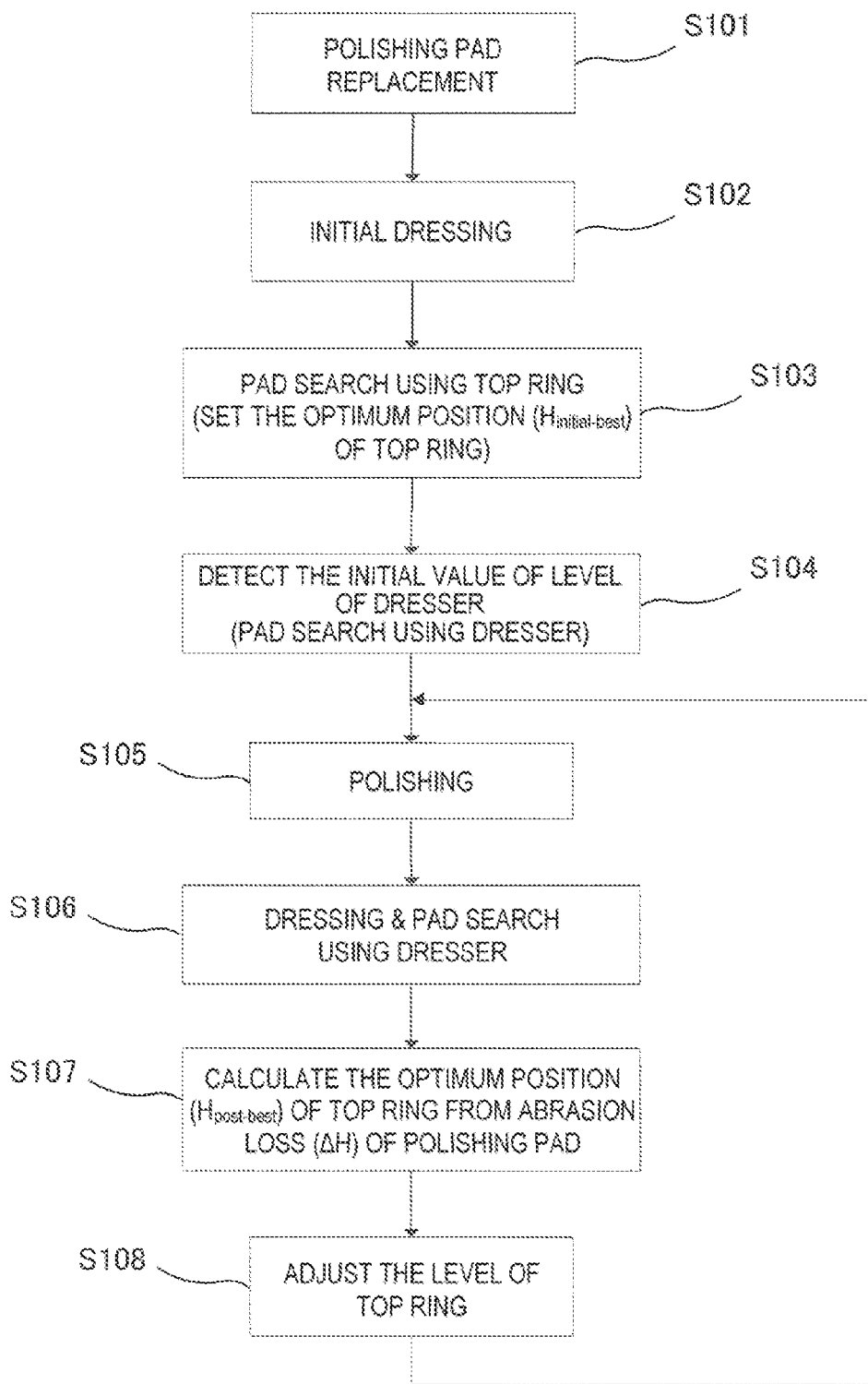
FIG. 19 is a flowchart showing a series of polishing processing steps carried out by the polishing unit according to one embodiment.

The following description will explain a series of polishing processing steps carried out by the polishing unit 300 configured as shown in FIGS. 4 and 5, with reference to FIG. 19. FIG. 19 is a flowchart showing the series of polishing processing steps carried out by the polishing unit 300 according to one embodiment. As shown in FIG. 19, the polishing processing steps start with replacement of the polishing pad 352 (Step S101). To be more specific, the polishing pad 352 worn away by polishing is removed from the polishing table 350, and a new polishing pad 352 is attached to the polishing table 350.

In this case, a brand-new polishing pad 352 has a surface which is not rough, and therefore lacks a polishing ability. Moreover, the polishing pad surface has undulation depending on a method, by which the polishing pad is attached to the polishing table 350, and due to individual variability of each product. In order to correct the undulation and make the polishing pad usable in polishing, it is necessary to carry out surface adjustment (dressing) which roughens the pad surface to increase a grinding ability. This initial surface adjustment (dressing) is referred to as initial dressing (Step S102).

Subsequently, the pad search using the top ring 302 is conducted by using a dummy substrate WF for pad search (Step S103). As described above, the pad search is the step of detecting the level (position) of the surface of the polishing pad 352.

The pad search using the top ring is conducted by detecting the level position of the top ring 302 when the lower surface of the top ring 302 is brought into contact with the surface (polishing surface) of the polishing pad 352. In other words, at the time of the pad search, the servomotor 38 is driven to lower the top ring 302 while the number of rotations is integrated by the encoder. When the lower surface of the top ring 302 contacts the surface of the polishing pad 352, the load on the servomotor 38 is increased, which increases the electric current flowing through the servomotor 38. In short, the electric current flowing through the servomotor 38 is detected by the current detector of the controller 900, and when the electric current is increased, it is determined that the lower surface of the top ring 302 contacts the surface of the polishing pad 352. When it is determined that the lower surface of the top ring 302 contact the surface of the polishing pad 352, the controller 900 calculates the lowering distance (position) of the top ring 302 from the integrated value obtained by the encoder of the servomotor 38, and stores the lowering distance. The controller 900 obtains the level of the surface of the polishing pad 352 from the lowering distance of the top ring 302, and calculates an optimum position of the top ring 302 before polishing, from the level of the surface of the polishing pad 352.

According to the present embodiment, the optimum position of the top ring 302 before polishing is such a position as to create a small gap between the lower surface (to-be-polished surface) of the substrate WF held by the top ring 302 and the surface (polishing surface) of the polishing pad 352. In other words, a level position of the top ring 302 in a state where there is the small gap between the lower surface (to-be-polished surface) of the substrate WF to be polished and the surface (polishing surface) of the polishing pad 352 while the lower surface (to-be-polished surface) of the substrate WF is not in contact with the surface (polishing surface) of the polishing pad 352 is set as the optimum position ($H_{initial-best}$) of the top ring 302 in the controller 900 (Step S103).

The pad search using the dresser 50 is then conducted (Step S104). The pad search using the dresser is conducted by detecting the level position of the dresser 50 at the point of time when the lower surface of the dresser 50 is brought into contact with the surface (polishing surface) of the polishing pad 352 with predetermined pressure. More specifically, the air cylinder 53 is driven to bring the dresser 50 into contact with the polishing surface 352a of the polishing pad 352 already subjected to the initial dressing. In this state, the displacement sensor 60 detects the initial position (initial value of the level) of the dresser 50 and stores the initial position (initial value of the level) in the controller 900. It is also possible to conduct both the initial dressing by Step S102 and the pad search using the dresser by Step S104 at the same time. In other words, as a final step of the initial dressing, the level position (initial position) of the dresser 50 is detected, and this initial position (initial value of the level) is stored in the controller 900.

If the initial dressing by Step S102 and the pad search using the dresser by Step S104 are conducted at the same time, the pad search using the top ring by Step S103 is subsequently conducted.

After receiving the substrate WF from the pusher 230 and holding the substrate WF, the top ring 302 is lowered to the preset position ($H_{initial-best}$) of the top ring, which is obtained by the pad search using the top ring in Step S103. When the top ring 302 is located at the preset position ($H_{initial-best}$), there is a small gap between the lower surface (to-be-polished surface) of the substrate WF and the surface (polishing surface) of the polishing pad 352 since the substrate WF is vacuum-held by the top ring 302 before the polishing. At this point of time, the polishing table 350 and the top ring 302 are rotation-driven together. In this state, the elastic membrane 4 (membrane) located on the rear surface side of the substrate WF is expanded to bring the lower surface (to-be-polished surface) of the substrate WF into contact with the surface (polishing surface) of the polishing pad 352. The polishing table 350 and the top ring 302 are then caused to make relative movements. In this manner, the polishing is carried out until the surface (to-be-polished surface) of the substrate WF comes into a predetermined state (has predetermined membrane thickness, for example) (Step S105).

When the polishing by Step S105 is finished, the top ring 302 delivers the polished substrate WF to the pusher 230 and receives another substrate WF to be polished from the pusher 230. The polishing pad 352 is dressed by the dresser 50 while the polished substrate WF is replaced with the substrate WF which is not yet polished, by the top ring 302 (Step S106).

The dressing of the polishing surface 352a of the polishing pad 352 is carried out as described below. The dresser 50 is pressed against the polishing surface 352a by the air cylinder 53. At the same time, pure water is fed from the pure water feeding nozzle, not shown, onto the polishing surface 352a. In this state, the dresser 50 rotates around the dresser shaft 51 to bring the lower surface (diamond particles) of the dressing member 50a into contact with the polishing surface 352a. As described above, the polishing pad 352 is ground by the dresser 50, thus dressing the polishing surface 352a.

After the dressing is finished, the pad search using the dresser 50 is conducted (Step S106). The pad search using the dresser is conducted as already discussed in the description of Step S104. The pad search using the dresser may be independently conducted after the dressing is finished. However, if measurement is performed following the dressing as a final step of the dressing, both the dressing and the pad search can be conducted at the same time. Therefore, the number of rotation of the dresser, that of the polishing table, and a load condition of the dresser in Step S104 are preferably set to be the same as those in Step S106. In this manner, the level position of the dresser 50 after the dressing is detected by the pad search using the dresser 50 (Step S106).

Subsequently, difference between the initial position (initial value of the level) of the dresser 50, which is obtained in Step S104, and the level position of the dresser 50 after the dressing, which is obtained in Step S106, is obtained, thus obtaining abrasion loss (ΔH) of the polishing pad 352.

The controller 900 calculates an optimum position ($H_{post-best}$) of the top ring 302 for polishing a subsequent substrate WF on the basis of a formula (1) from the abrasion loss (ΔH) of the polishing pad 352 obtained in the aforementioned manner and the preset position ($H_{initial-best}$) of the top ring 302 at the time of the polishing, which is obtained by the pad search using the top ring 302 in Step S103 (Step S107).

$$H_{post-best} = H_{inital-best} + \Delta H \qquad (1)$$

Specifically, the abrasion loss (ΔH) of the polishing pad that is a factor affecting the level position of the top ring at the time of the polishing is detected. On the basis of the detected abrasion loss (ΔH) of the polishing pad, the preset position ($H_{initial-best}$) of the top ring 302 at the time of the polishing, which is previously set, is corrected, and the preset position ($H_{post-best}$) of the top ring 302 for polishing the subsequent substrate WF is obtained, thus conducting control so that the top ring is always located at the optimum level position at the time of the polishing.

The servomotor 38 is then driven to lower the top ring 302 holding the substrate WF to the preset position ($H_{post-best}$) of the top ring 302, which is obtained in Step S107, thus making a level adjustment of the top ring 302 (Step S108). Thereafter, the process including Steps S105 to S108 is repeated until the polishing pad becomes worn away, to thereby polish a large number of substrates WF. The Step S101 is then repeated again, in which the polishing pad is replaced.

As already discussed with reference to the flowchart shown in FIG. 19, according to the present embodiment, the abrasion loss (ΔH) of the polishing pad that is a factor affecting the level position of the top ring at the time of the polishing is detected during operation of the polishing unit 300. On the basis of the detected abrasion loss (ΔH) of the polishing pad, the preset position ($H_{initial-best}$) of the top ring 302, which is previously set, is corrected, and the preset position ($H_{initial-best}$) of the top ring 302 for polishing the subsequent substrate WF is obtained, thus conducting the control so that the top ring is always located at the optimum level position during the polishing. The pad search using the top ring, which is conducted so that the preset position of the top ring during the polishing is applied directly to the top ring, has to be performed only when the polishing pad is replaced, which immensely improves throughput.

According to the flowchart shown in FIG. 19, the pad search using the top ring (S103) and the pad search using the dresser (S104) are conducted when the polishing pad 352 is replaced. According to one embodiment, the pad search using the top ring (S103) and the pad search using the dresser (S104) may be conducted at any timing. For example, in a case where a substrate WF different in thickness is polished without replacing the polishing pad 352, the optimum position ($H_{initial-best}$) of the top ring 302 is set again by conducting the pad search using the top ring (S103). At this time, the pad search using the dresser (S104) may be conducted. The Steps S105 to S108 may carried out after the optimum position ($H_{initial-best}$) of the top ring 302 is set again for the substrate WF different in thickness.

Figure 9:
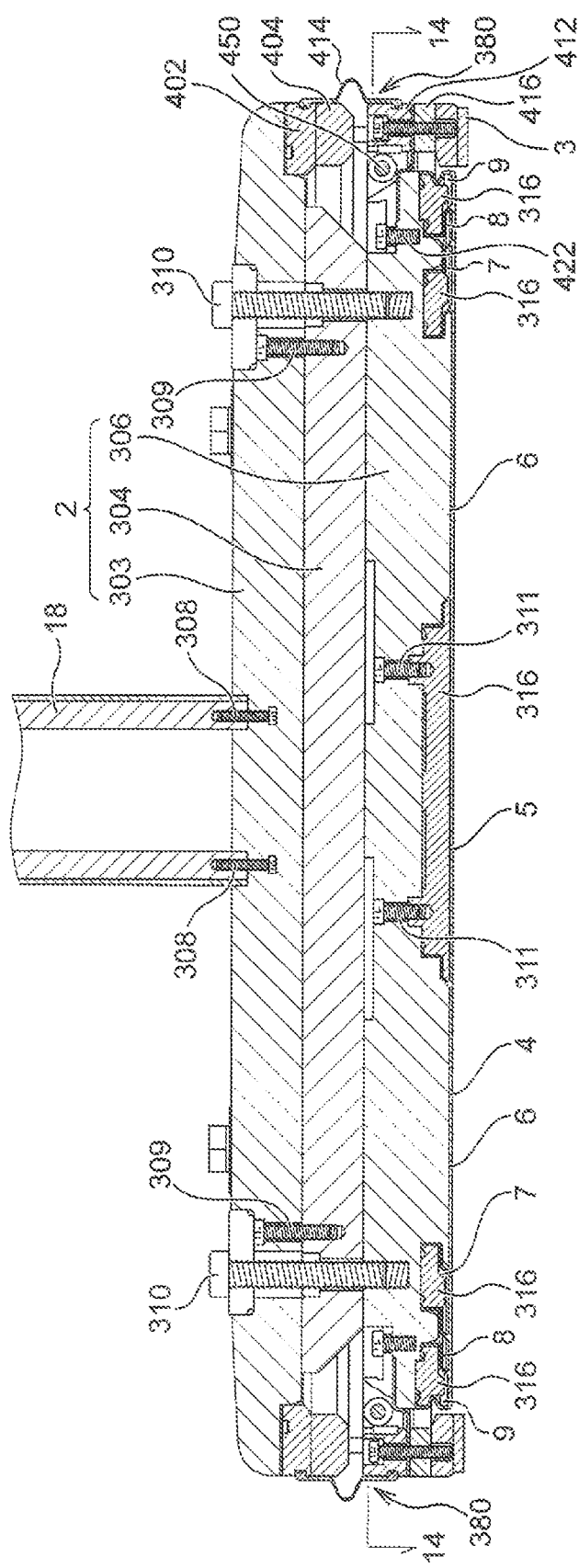
FIG. 9 is a sectional view of a detailed structure of the top ring according to one embodiment.

FIG. 9 is a sectional view of a detailed structure of the top ring 302 according to one embodiment. FIG. 9 corresponds to a sectional view of the top ring 302 shown in FIG. 4 taken along arrow 9-9. According to the embodiment shown in FIG. 9, the top ring 302 has the top ring body 2 and the retainer portion 380. The top ring body 2 includes a quadrangular plate-like upper member 303, an intermediate member 304 attached to a lower surface of the upper member 303, and a lower member 306 attached to a lower surface of the intermediate member 304. The retainer portion 380 is attached to an outer peripheral portion of the upper member 303. The upper member 303 is coupled to the top ring shaft 18 with bolts 308 or the like. The intermediate member 304 is coupled to the upper member 303 with bolts 309. The lower member 306 is coupled to the upper member 303 with bolts 310. The upper member 303, the intermediate member 304, and the lower member 306 can be made of metal material or plastic material. According to one embodiment, the upper member 303 is made of stainless steel (SUS), and the intermediate member 304 and the lower member 306 are made of plastic material.

As shown in FIG. 9, attached to a lower surface of the lower member 306 is the elastic membrane 4 which contacts the rear surface of the substrate WF. The elastic membrane 4 is attached to the lower surface of the lower member 306 by using three concentric holders 316 (a center portion is a columnar thin member; and the other two located in the vicinity are quadrangular ring-like members) as shown in the figure. The holders 316 are fixed to the lower member 306 with bolts 311 or the like. The elastic membrane 4 can be attached to the lower surface of the lower member 306 by being held between the holders 316 and the lower member 306. The elastic membrane 4 shown in FIGS. 8A to 8C has the above-described shape. The partition walls 4a form a plurality of sections.

As shown in FIGS. 5 and 9, the elastic membrane 4 and the lower surface of the lower member 306 define the center chamber 5, the ripple chamber 6, the intermediate chamber 7, the outer chamber 8, and the edge chamber 9. As shown in FIG. 5, the center chamber 5, the ripple chamber 6, the intermediate chamber 7, the outer chamber 8, and the edge chamber 9 are in communication with the passages 11, 12, 13, 14 and 15, respectively. The fluid is fed into the center chamber 5, the ripple chamber 6, the intermediate chamber 7, the outer chamber 8, and the edge chamber 9 through the foregoing passages, which makes it possible to control inner pressure of the chambers 5, 6, 7, 8 and 9 in a separate manner. When the substrate WF is polished, therefore, contact pressure applied to the polishing pad 352 can be controlled with respect to each area region of the substrate WF.

Figure 10:
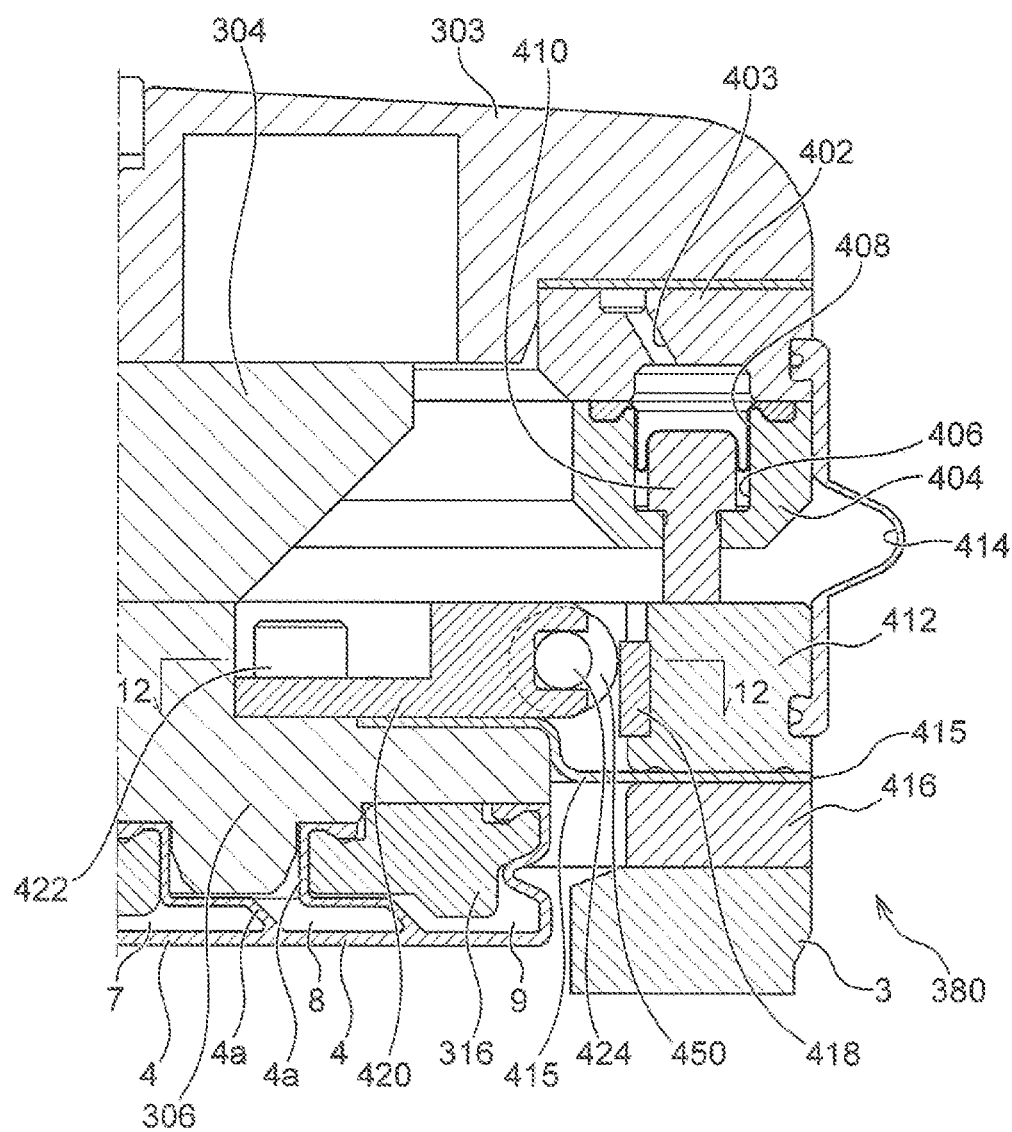
FIG. 10 is an enlarged sectional view of a retainer portion shown in the sectional view of FIG. 9.
Figure 11:
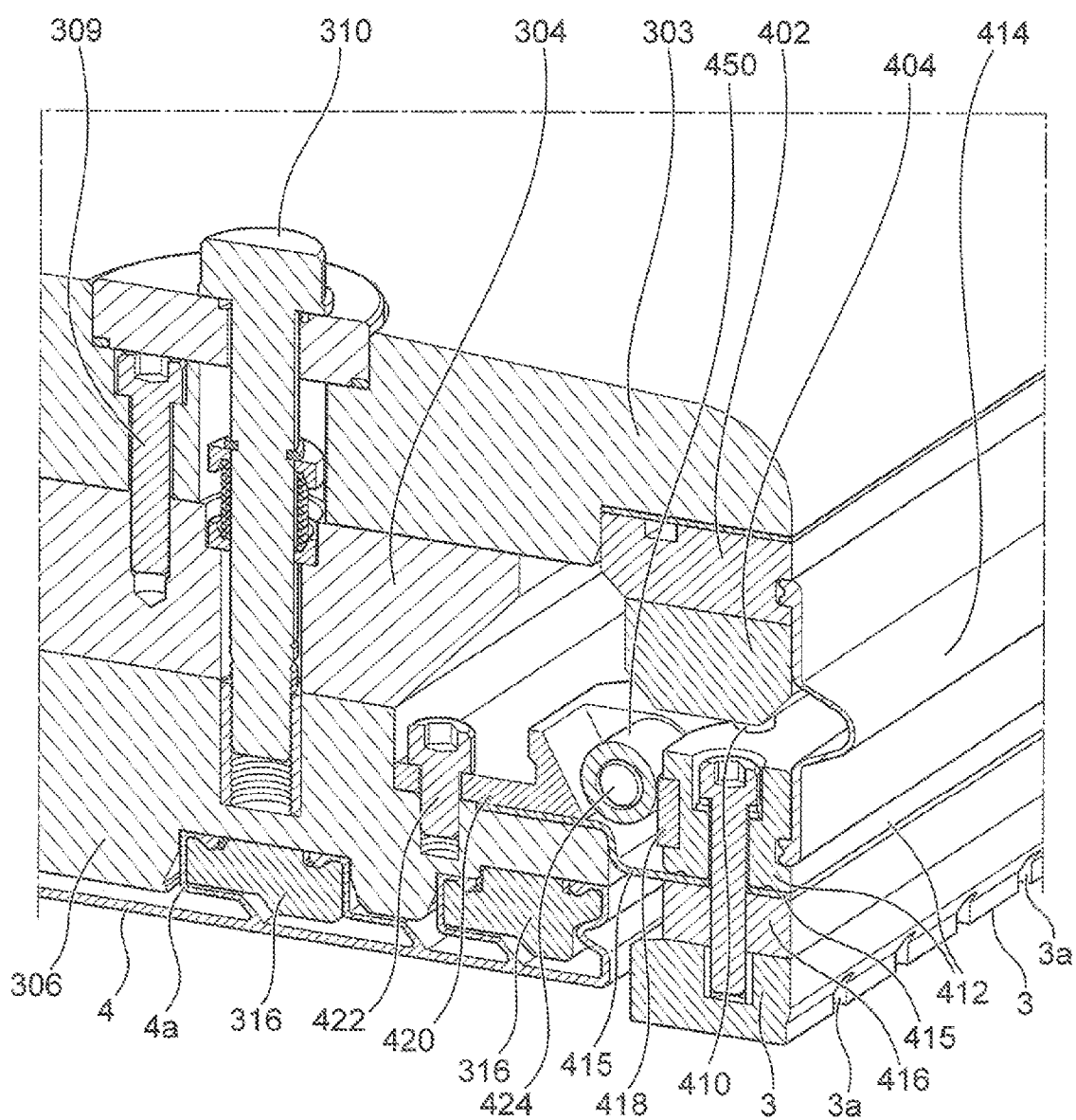
FIG. 11 is an enlarged sectional perspective view of the retainer portion shown in the sectional view of FIG. 9.

FIG. 10 is an enlarged sectional view of the retainer portion 380 shown in the sectional view of FIG. 9. FIG. 11 is an enlarged sectional perspective view of the retainer portion 380 shown in the sectional view of FIG. 9. As shown in the figures, the retainer portion 380 is provided to the outer peripheral portion of the upper member 303. As shown in the figures, an upper housing 402 is coupled to a lower surface of the outer peripheral portion of the upper member 303. According to one embodiment, the upper housing 402 can be fixed to the upper member 303 with a bolt or the like with a seal packing intervening therebetween. Provided under the upper housing 402 is a lower housing 404. According to one embodiment, the upper housing 402 and the lower housing 404 are a quadrangular ring-like member as a whole and can be made of polyphenylene sulfide (PPS) resin. A cylindrical cylinder 406 is defined inside the lower housing 404. Disposed in the cylinder 406 is a diaphragm 408. According to one embodiment, the diaphragm 408 is made of rubber material. The diaphragm 408 can be secured by being held between the upper housing 402 and the lower housing 404. The cylinder 406 has an interior space which is divided by the diaphragm 408 into an upper space and a lower space. A piston 410 is disposed in the diaphragm 408 of the lower housing 404. The piston 410 has one end which is in contact with a lower surface of the diaphragm 408. The other end of the piston 410 extends from the underside of the lower housing 404 and is in contact with a retainer supporting guide 412. According to one embodiment, the piston 410 can be made of PPS resin.

Figure 13:
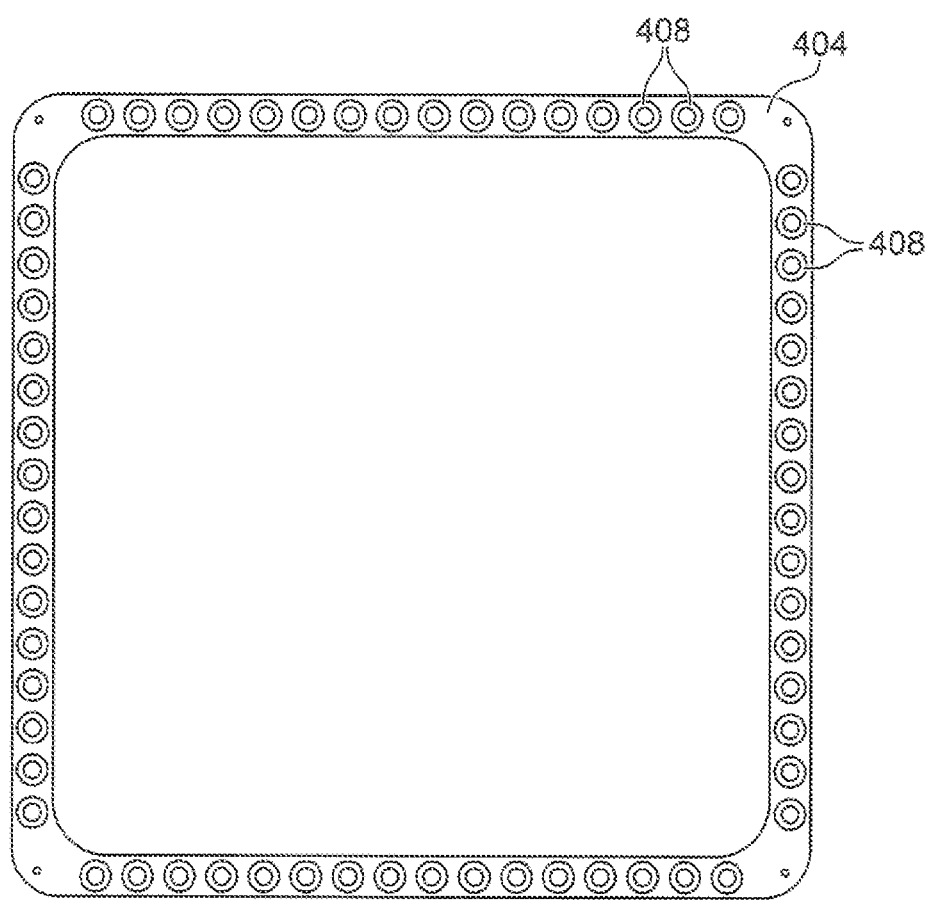
FIG. 13 is a plan view of a lower housing as viewed from above according to one embodiment.

FIG. 13 is a plan view of the lower housing 404 as viewed from above. According to one embodiment, a plurality of cylinders 406 are formed in the lower housing 404. The diaphragm 408 and the piston 410 are disposed in each of the cylinders 406. FIG. 13 shows the plurality of cylinders 406 formed in the lower housing 404 and the diaphragms 408 disposed in the respective cylinders 406. The use of the cylinders 406, the diaphragms 408, and the pistons 410, which have an identical shape as shown in the figure, reduces a cost for manufacturing these parts. For example, at the time of manufacturing the top ring bodies 2 with different dimensions, the diaphragms 408 and the pistons 410 which are the same components can be used, and the number of the diaphragms 408 and the pistons 410 to be used can be changed according to the sizes of the top ring bodies 2.

The upper housing 402 is provided with a passage 403 (shown as the passage 16 in FIG. 5). The passage 403 is connected to a fluid source (for example, the pressure adjuster 30 in FIG. 5). Fluid (air or nitrogen, for example) can be fed from the fluid source through the passage 403 into the upper spaces of the cylinders 406 of the lower housing 404. Once the fluid is fed into the upper spaces of the cylinders 406, the diaphragms 408 expand downwards to cause the pistons 410 to move in the downward direction, and the downward motion of the pistons 410 enables the retainer supporting guide 412 to move in the downward direction.

According to one embodiment, as shown in FIGS. 10 and 11, a band 414 is attached to an outer lateral surface of the upper housing 402 and an outer lateral surface of the retainer supporting guide 412 so as to extend therebetween. The band 414 allows the retainer supporting guide 412 to displace relative to the lower housing 404 and also prevents polishing liquid or the like from entering into space between the lower housing 404 and the retainer supporting guide 412.

As shown in the figure, a retainer guide 416 is attached to a lower surface of the retainer supporting guide 412. According to one embodiment, as shown in the figure, a seal packing 415 made of rubber material or the like is disposed between the retainer supporting guide 412 and the retainer guide 416. The retainer member 3 is attached to a lower surface of the retainer guide 416 as shown in the figure. As shown in FIG. 11, the retainer supporting guide 412, the retainer guide 416, and the retainer member 3 can be fixed with bolts. The retainer supporting guide 412 and the retainer guide 416 are quadrangular ring-like members as a whole. According to one embodiment, the retainer supporting guide 412 and the retainer guide 416 are made of stainless steel (SUS). The retainer member 3 is made of PPS resin, polyvinyl chloride resin or the like. As described above, the retainer member 3 is moved downwards by moving the retainer supporting guide 412 in the downward direction by the pistons 410 disposed in the lower housing 404.

According to one embodiment, the top ring 302 includes a retainer guiding device which guides the retainer member 3 so that the retainer member 3 is deformable in a vertical direction, and supports the retainer member 3 to inhibit the retainer member 3 from displacing in a horizontal direction. According to one embodiment, as shown in FIGS. 10 and 11, the retainer supporting guide 412, the retainer guide 416, and the retainer member 3 are movable in the vertical direction by being supported and guided by a supporting roller 450. As shown in the figures, a supporting pad 418 is fixed on an inner lateral surface of the retainer supporting guide 412. As shown in the figures, the retainer supporting guide 412, the retainer guide 416, and the retainer member 3 move in the vertical direction while the supporting pad 418 fixed to the retainer supporting guide 412 is in contact with and supported by the supporting roller 450. One embodiment may be configured so that a small gap is created between the supporting pad 418 fixed to the retainer supporting guide 412 and the supporting roller 450. According to one embodiment, the supporting pad 418 can be made of PPS resin, vinyl chloride resin, PEEK resin or the like.

As shown in FIGS. 10 and 11, a retainer supporting frame 420 is fixed to the lower member 306 of the top ring body 2. As shown in FIG. 11, the retainer supporting frame 420 is fixed to the lower member 306 with a bolt 422. As shown in FIGS. 10 and 11, the seal packing 415 is held between the lower member 306 and the retainer supporting frame 420. As shown in figures, the seal packing 415 extends from an area located between the lower member 306 and the retainer supporting frame 420 to an area located between the retainer supporting guide 412 and the retainer guide 416. It can be said that the seal packing 415 extends from the top ring body 2 to the retainer portion 380. The seal packing 415 is therefore capable of preventing the polishing liquid or the like from entering into an inner side of the top ring 302 from between the top ring body 2 and the retainer portion 380.

Figure 12:
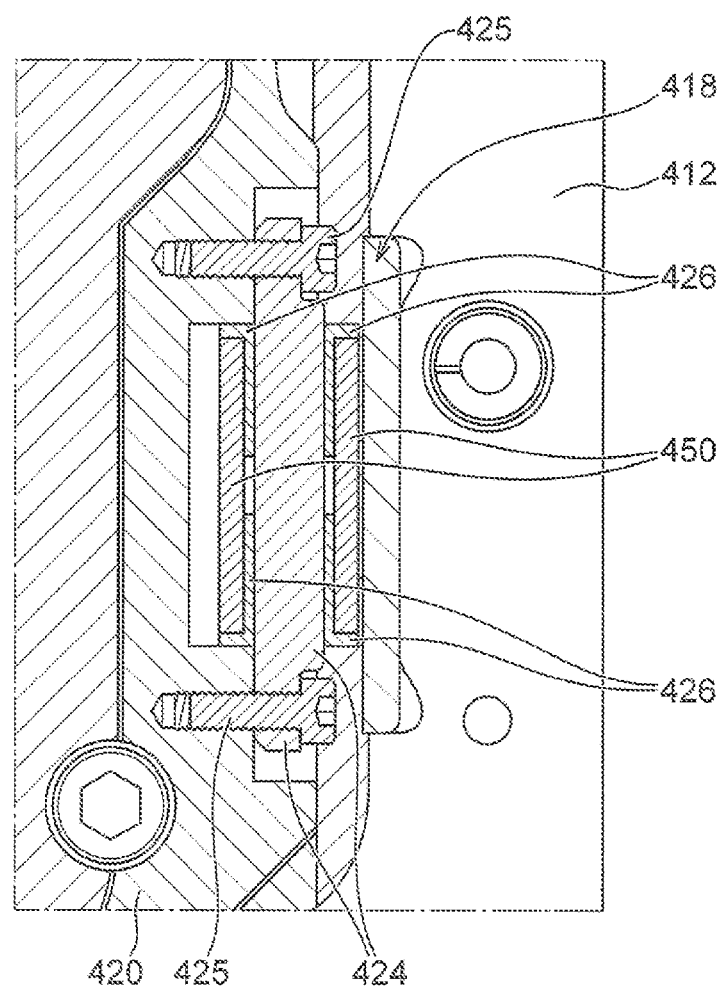
FIG. 12 is a sectional view as viewed in a direction of arrows 12 of FIG. 10, which shows a structure of a supporting roller.

As shown in FIG. 11, a shaft 424 is fixed to the retainer supporting frame 420. FIG. 12 is a sectional view as viewed in a direction of arrows 12 of FIG. 10, which shows a structure of the supporting roller 450. As shown in FIG. 12, the shaft 424 is fixed to the retainer supporting frame 420 with a bolt 425. The shaft 424 extends parallel to a surface of the top ring body 2, on which the substrate WF is held. It can be said that the shaft 424 extends in a direction parallel to sides of a quadrangle formed by the top ring body 2 having a substantially quadrangular shape. As shown in FIG. 12, the supporting roller 450 is fixed around the shaft 424 through a low friction sliding bearing 426. The supporting roller 450 is freely rotatable around the shaft 424. According to one embodiment, the shaft 424 and the supporting roller 450 are made of metal, such as SUS. According to one embodiment, the low friction sliding bearing 426 is made of oil-impregnated polyacetal. According to one embodiment, the low friction sliding bearing 426 may be a cylindrical roller bearing.

Figure 14:
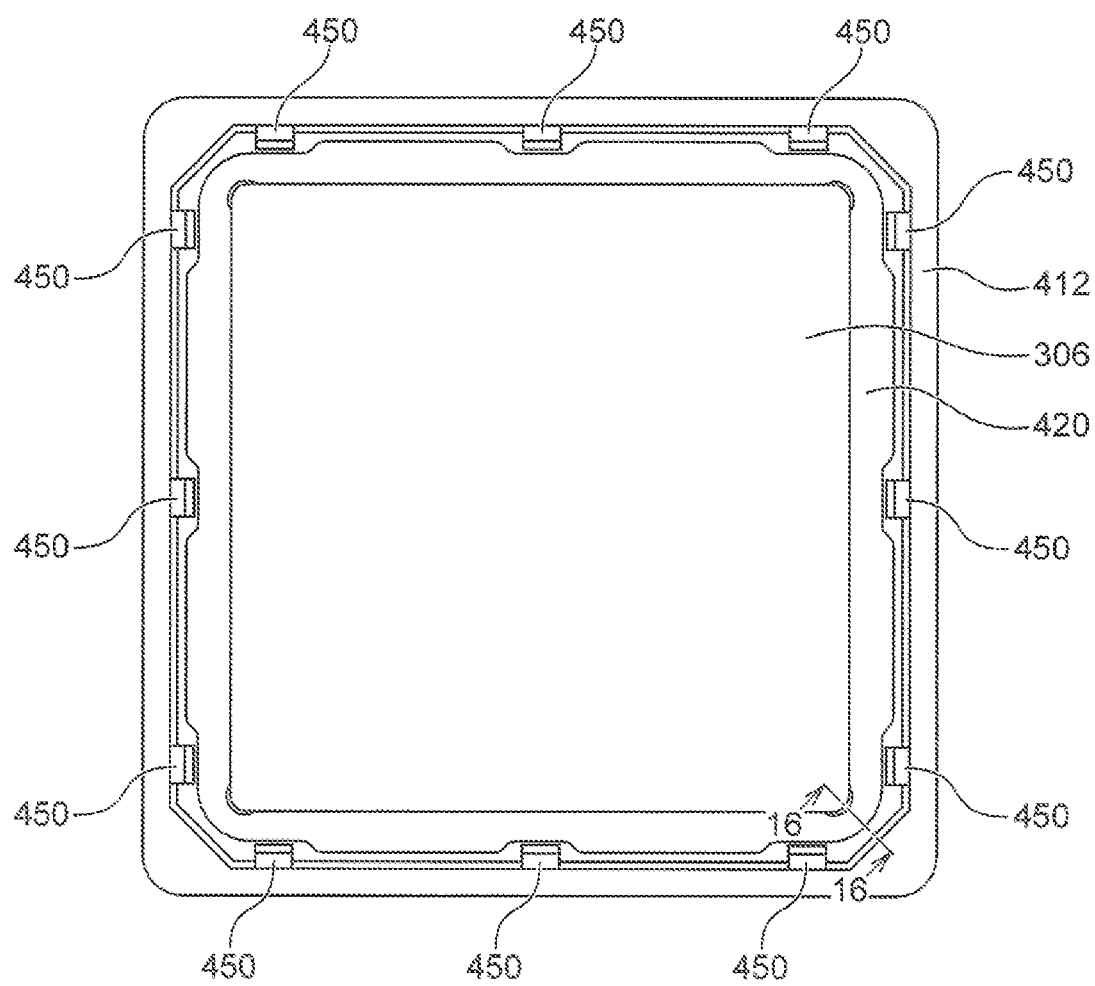
FIG. 14 is a sectional view as viewed in a direction of arrows 14 of FIG. 9.

According to one embodiment, the supporting roller 450 comprises a plurality of supporting rollers 450 disposed in the retainer portion 380 along each side of the retainer portion 380 having a quadrangular ring-like shape. FIG. 14 is a sectional view as viewed in a direction of arrows 14 of FIG. 9. As shown in FIG. 14, the retainer supporting frame 420 having a quadrangular shape is provided with three supporting rollers 450 at each side thereof. Although, according to the embodiment shown in the figure, the retainer supporting frame 420 is provided with the three supporting rollers 450 at each side thereof, the retainer supporting frame 420 may be provided with one supporting roller 450 or two or more supporting rollers 450 at each side thereof as another embodiment.

Figure 16:
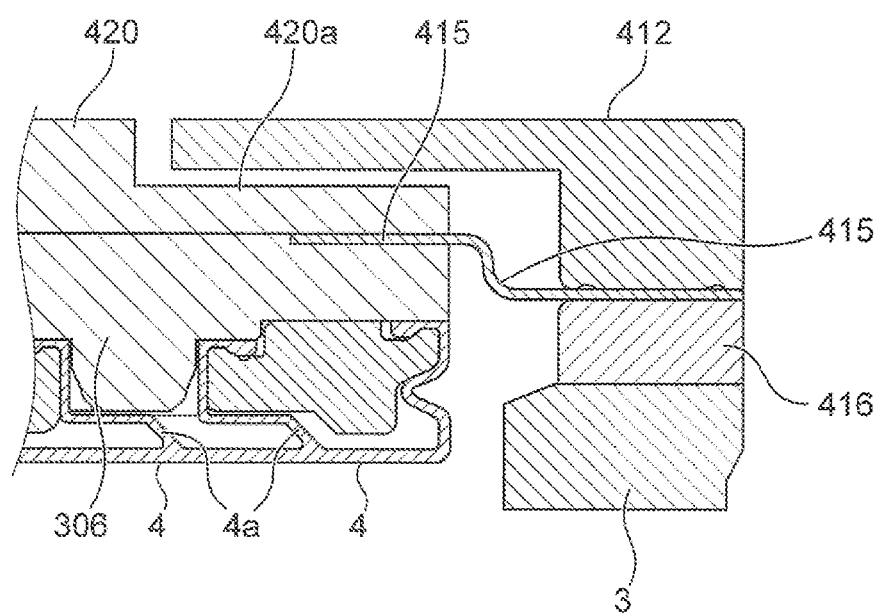
FIG. 16 is a sectional view as viewed in a direction of arrows 16 of FIG. 14.

As described above, the retainer supporting guide 412, the retainer guide 416, and the retainer member 3 are movable in the vertical direction. According to one embodiment, the top ring 302 may include a stopper which regulates motion of the retainer supporting guide 412, the retainer guide 416, and the retainer member 3, which are vertically movable. FIG. 16 is a sectional view as viewed in a direction of arrows 16 of FIG. 14. As shown in FIGS. 14 and 16, at a corner of the quadrangular top ring 302, a portion of the retainer supporting frame 420 is placed beneath the retainer supporting guide 412. An upper surface of the retainer supporting frame 420 beneath the retainer supporting guide 412 defines a stop surface 420a. When the retainer supporting guide 412 moves downwards, the lower surface of the retainer supporting guide 412 contacts the stop surface 420a of the retainer supporting frame 420. The stop surface 420a of the retainer supporting frame 420 therefore defines a limit value of a downward motion amount of the retainer supporting guide 412, the retainer guide 416, and the retainer member 3. According to one embodiment, a supporting pad made of resin or the like may be provided to the stop surface 420a of the retainer supporting frame 420 or a surface of the retainer supporting guide 412, which contacts the retainer supporting frame 420. If the retainer supporting frame 420 and the retainer supporting guide 412 are both made of metal material, waste metal is sometimes generated by metal-to-metal contact. The supporting pad is disposed to prevent such waste metal from being generated. According to one embodiment, the supporting pad can be made of the same material as the supporting pad 418 attached to the retainer supporting guide 412.

According to the above-discussed embodiment, the supporting roller 450 is capable of supporting horizontal load applied from the substrate WF during the polishing. For example, in a state shown in FIG. 14, force is applied in the right-hand direction from the substrate WF to the retainer member 3. In this case, the supporting pad 418 attached to the retainer supporting guide 412 of the retainer portion 380 located on the left-hand side of the top ring 302 presses the supporting roller 450 (on the left) in the right-hand direction. The shaft 424 of the supporting roller 450 is fixed to the retainer supporting frame 420. The retainer supporting frame 420 is fixed to the lower member 306. Therefore, the retainer member 3 is prevented from moving in the horizontal direction when the supporting roller 450 receives the load that is generated when the retainer member 3 is applied with a horizontal force.

Figure 15:
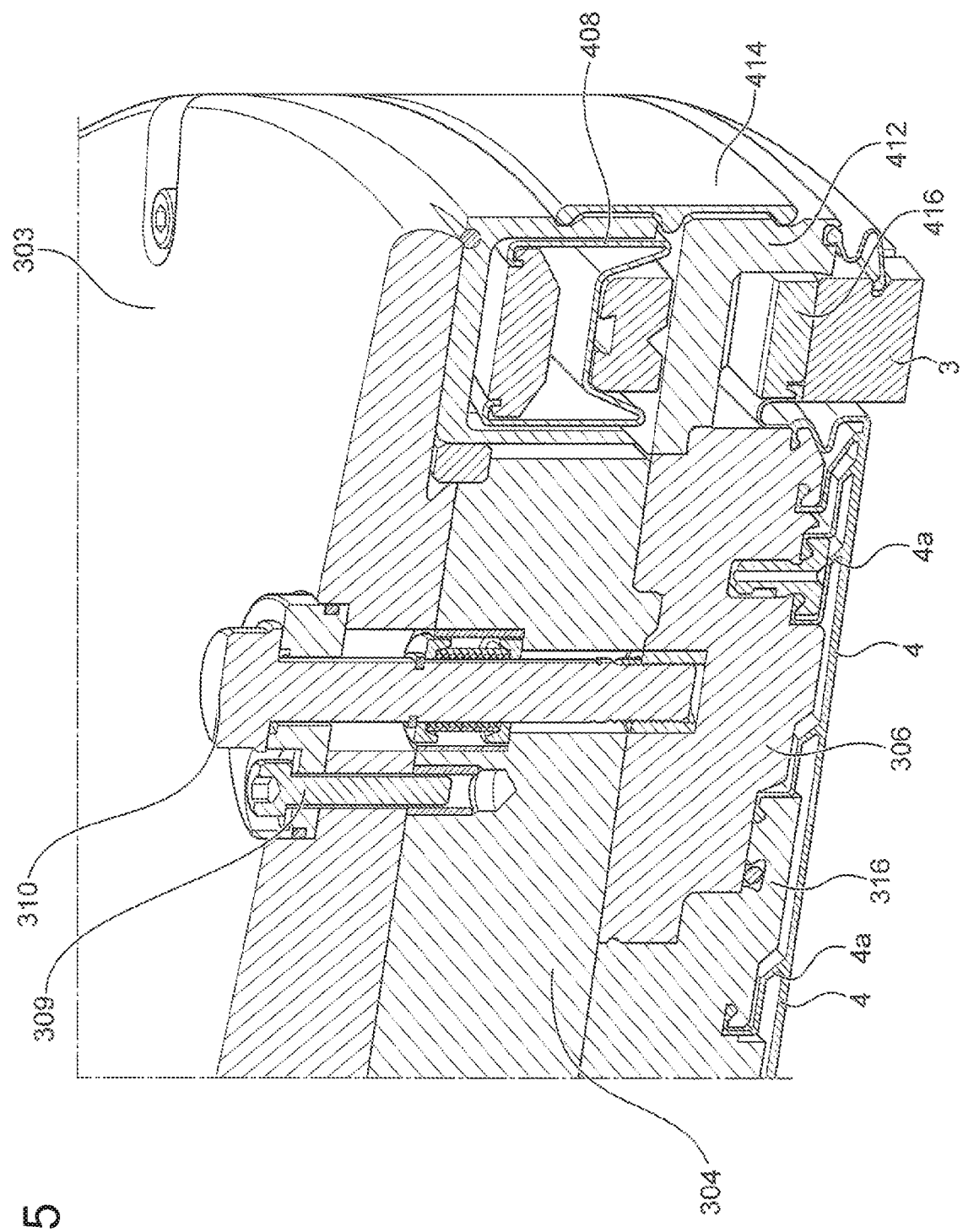
FIG. 15 is a sectional perspective view of a retainer portion of a top ring as a reference example and a periphery of the retainer portion.

As shown in FIG. 14, the supporting roller 450 is disposed on an inner side of the retainer portion 380. This makes it possible to reduce dimensions of the top ring 302, as compared to a configuration in which a horizontal load is supported from an outer side of the retainer portion. FIG. 15 is a sectional perspective view showing a retainer portion of a top ring as a reference example and a periphery of the retainer portion. A top ring 302 of FIG. 15 is formed in a circular shape and yet has a similar configuration to the top ring 302 of FIG. 11. Like the top ring 302 shown in FIG. 11, the top ring 302 as the reference example shown in FIG. 15 is configured so that fluid is fed into a cylinder 406 to drive a piston 410 through a diaphragm 408, and a retainer guide 416 and a retainer member 3 thus can be moved in a vertical direction. In the top ring 302 as the reference example shown in FIG. 15, however, a retainer supporting guide 412 is fixed to a lower member 306 of a top ring body 2 of the top ring 302, and does not move relative to the top ring body 2. In the top ring 302 according to an embodiment shown in FIG. 15, the retainer supporting guide 412 extends in an outer peripheral direction of the retainer guide 416 and the retainer member 3 and contacts an outer lateral surface of the retainer member 3 to support the retainer member 3. The retainer member 3 is therefore displaceable in the vertical direction while being supported by the retainer supporting guide 412. According to the reference example shown in FIG. 15, a horizontal load applied from a substrate WF to the retainer member 3 during the polishing of the substrate WF is supported from an outer side of the retainer member 3 by the retainer supporting guide 412. According to the reference example shown in FIG. 15, since the retainer supporting guide 412 supports the retainer member 3 from the outer side, the retainer supporting guide 412 is increased in radial dimension. On the other hand, according to the embodiment shown in FIG. 11 and the other figures, the retainer member 3 is supported from the inner side of the retainer member 3 by the supporting roller 450. This eliminates the necessity of increasing the dimensions of the retainer supporting guide 412 as seen in the reference example shown in FIG. 15. According to the above-discussed embodiment of the present patent application, therefore, the top ring 302 can be reduced in dimensions.

According to the above-discussed embodiment, a rotating force of the top ring shaft 18 is transmitted to the upper member 303, the intermediate member 304, and the lower member 306. The rotating force is further transmitted from the retainer supporting frame 420 fixed to the lower member 306 to the supporting roller 450, and then transmitted from the supporting roller 450 through the supporting pad 418 to the retainer portion 380. The rotating force of the top ring body 2 of the top ring 302 is consequently transmitted through the supporting roller 450 to the retainer portion 380.

According to the above-discussed embodiment, fluid is fed through the passage 403 to the cylinder 406 to drive the piston 410 through the diaphragm 408. The retainer member 3 is thus moved in the vertical direction and pressed against the polishing pad 352. The pressure with which the retainer member 3 is pressed against the polishing pad 352 can be controlled by pressure of the fluid which is fed to the cylinder 406. According to the above-discussed embodiment, when the retainer member 3 moves in the vertical direction, the retainer member 3 moves while being guided by the supporting roller 450. This makes it possible to reduce resistance between the supporting roller 450 and the supporting pad 418. According to the reference example shown in FIG. 15, the retainer supporting guide 412 guides the vertical motion of the retainer member 3 while contacting the outer lateral surface of the retainer member 3 and supporting the horizontal load. According to the reference example shown in FIG. 15, therefore, resistance which is generated when the vertical motion of the retainer member 3 is guided is larger than when the supporting roller 450 according to the embodiment of the present patent application is used.

<Drying Unit>

The drying unit is a device for drying the substrate WF. According to the substrate processing apparatus 1000 shown in FIG. 1, the drying unit 500 dries the substrate WF which is washed in the washing section of the conveyance unit 200 after being polished by the polishing unit 300. As shown in FIG. 1, the drying unit 500 is disposed downstream of the conveyance unit 200.

Figure 17:
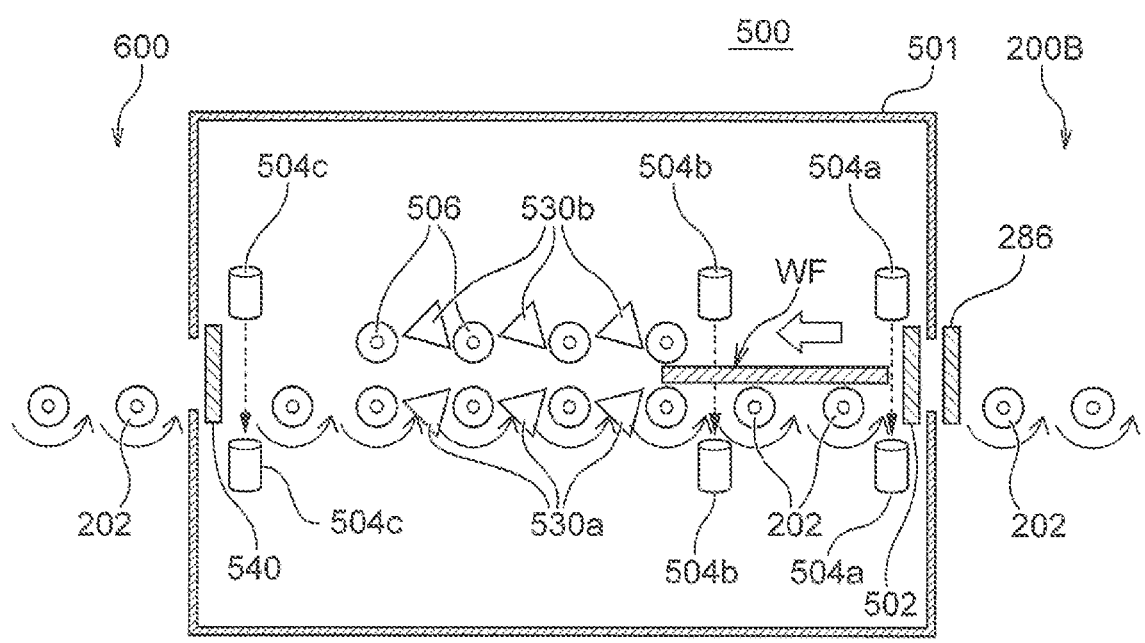
FIG. 17 is a lateral view showing a drying unit in a diagram according to one embodiment.

FIG. 17 is a lateral view showing the drying unit 500 in a diagram according to one embodiment. The drying unit 500 includes conveyance rollers 202 for conveying the substrate WF. According to one embodiment, the conveyance rollers 202 of the drying unit 500 can be made of conductive polymer. The conveyance rollers 202 are electrically grounded through the roller shafts 204 or the like. This is to prevent the substrate WF from being electrified and damaged. According to one embodiment, the drying unit 500 may be provided with an ionizer (not shown) to prevent the electrification of the substrate WF. The conveyance rollers 202 of the drying unit 500 are driven by the gear 206 and the motor 208 as with the conveyance rollers 202 of the conveyance unit 200. As shown in FIG. 17, the drying unit 500 has an inlet shutter 502 on an inlet side thereof. The inlet shutter 502 is openable/closable. As shown in FIG. 17, the drying unit 500 includes a sensor 504 for detecting the presence/absence of the substrate WF at a predetermined position on the conveyance rollers 202. The sensor 504 may be of any form and may be an optical sensor, for example. According to the embodiment shown in FIG. 17, the sensor 504 comprises three sensors (504a to 504c), and the sensors 504a to 504c are disposed in the drying unit 500. According to one embodiment, the operation of the drying unit 500 can be controlled on the basis of the detection of the substrate WF by the sensors 504a to 504c.

According to the embodiment shown in FIG. 17, the drying unit 500 includes a nozzle 530 for injecting gas toward the substrate WF which is conveyed on the conveyance rollers 202. The gas may be, for example, compressed air or nitrogen. According to the embodiment shown in the figure, the nozzle 530 includes a lower nozzle 530a disposed below the conveyance rollers 202 and an upper nozzle 530b disposed above the conveyance rollers 202. The lower nozzle 530a is disposed so as to inject the gas to the lower surface of the substrate WF which is conveyed on the conveyance rollers 202. The upper nozzle 530b is disposed so as to inject the gas to the upper surface of the substrate WF which is conveyed on the conveyance rollers 202. The lower nozzle 530a and the upper nozzle 530b are substantially equal or larger in width, as compared to the substrate WF which is conveyed. This makes it possible to inject the gas over the entire substrate WF which is conveyed, using the lower nozzle 530a and the upper nozzle 530b. The drying unit 500 is capable of drying the substrate WF by using the lower nozzle 530a and the upper nozzle 530b to blow water drops off the substrate WF which is conveyed. Each of the lower nozzle 530a and the upper nozzle 530b may comprise a single nozzle or a plurality of nozzles arranged in a conveying direction of the substrate WF. According to the present embodiment, each of the upper nozzle 530b and the lower nozzle 530a comprises three nozzles. Each of the nozzles 530 may have a form in which a gas feeding opening has a shape like a slit extending in length substantially equal to the width of the substrate WF.

The drying unit 500 shown in FIG. 17 includes upper conveyance rollers 506 disposed on the conveyance rollers 202. The upper conveyance rollers 506 are connected to a power source and configured to be rotatable. According to one embodiment, the upper conveyance rollers 506 are configured to be driven by the gear 206 and the motor 208 as with the conveyance rollers 202.

<Unload Unit>

The unload unit 600 is a unit for conveying the substrate WF subjected to processing, such as polishing and washing, outside the substrate processing apparatus 1000. According to the substrate processing apparatus 1000 shown in FIG. 1, the unload unit 600 receives the substrate dried by the drying unit 500. As shown in FIG. 1, the unload unit 600 is disposed downstream of the drying unit 500.

Figure 18:
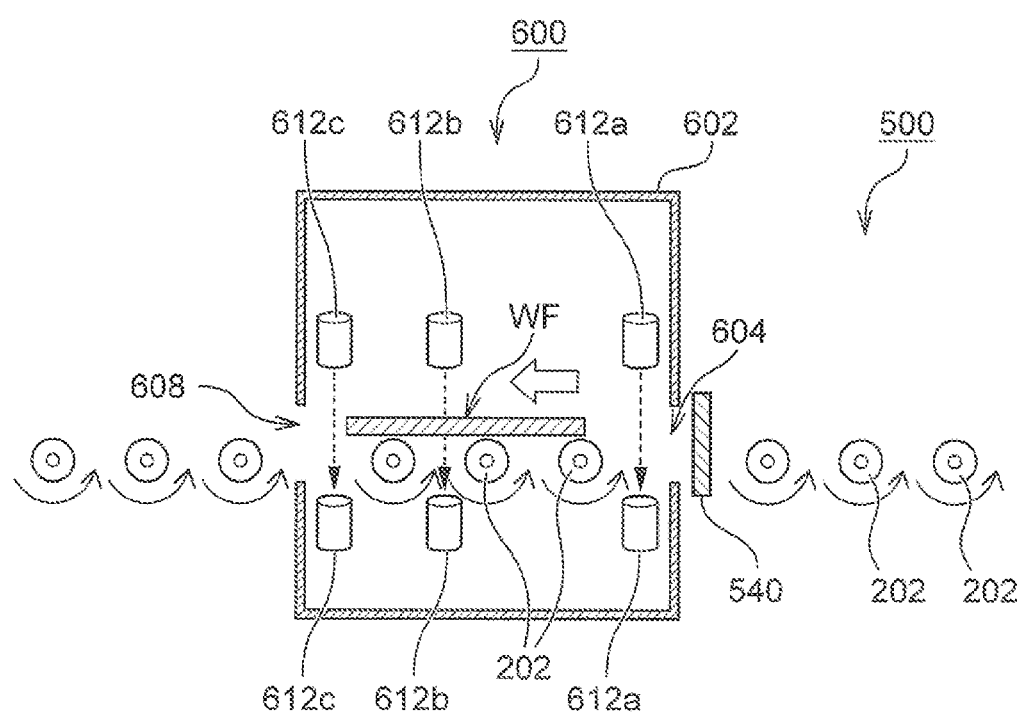
FIG. 18 is a lateral view showing an unload unit in a diagram according to one embodiment.

FIG. 18 is a lateral view showing the unload unit 600 in a diagram according to one embodiment. According to one embodiment, the unload unit 600 includes a housing 602. The housing 602 includes an inlet opening 604 on a side where the housing 602 receives the substrate WF. According to the embodiment shown in FIG. 18, the right-hand side is an inlet side. The unload unit 600 receives the substrate WF from the inlet opening 604. According to one embodiment, the unload unit 600 is configured in compliance with SMEMA (Surface Mount Equipment Manufactures Association) Mechanical Equipment Interface Standard (IPC-SMEMA-9851).

According to the embodiment shown in FIG. 18, the unload unit 600 includes a plurality of conveyance rollers 202 for conveying the substrate WF. The substrate on the conveyance rollers 202 can be conveyed in a predetermined direction by rotating the conveyance rollers 202. According to one embodiment, the conveyance rollers 202 of the unload unit 600 can be made of conductive polymer. According to one embodiment, the conveyance rollers 202 are electrically grounded through the roller shafts 204 or the like. This is to prevent the substrate WF from being electrified and damaged. According to one embodiment, the unload unit 600 may be provided with an ionizer (not shown) to prevent the electrification of the substrate WF.

According to the embodiment shown in the figure, the housing 602 of the unload unit 600 includes an outlet opening 608 for the substrate WF. The unload unit 600 includes a sensor 612 for detecting the presence/absence of the substrate WF at a predetermined position on the conveyance rollers 202. The sensor 612 may be of any form and may be an optical sensor, for example. According to the embodiment shown in FIG. 18, the sensor 612 comprises three sensors 612 disposed in the housing 602. The sensors 612 include a sensor 612a disposed near the inlet opening 604, a sensor 612b disposed near a center of the unload unit 600, and a sensor 612c disposed near the outlet opening 608. According to one embodiment, the operation of the unload unit 600 can be controlled on the basis of the detection of the substrate WF by the sensors 612. For example, if the sensor 612a located near the inlet opening 604 detects the presence of the substrate WF, the conveyance rollers 202 within the unload unit 600 may start rotating or may be changed in rotating speed.

The conveyance route of the substrate WF in the above-described substrate processing apparatus 1000 will be explained below. The operation of the substrate processing apparatus 1000 is controlled by the controller 900. Another processing apparatus is disposed upstream of the substrate processing apparatus 1000. The substrate WF processed by the upstream-side processing apparatus is conveyed from the inlet opening 104 of the load unit 100 of the substrate processing apparatus 1000. According to the above-discussed embodiment, the substrate WF is conveyed with the surface to be polished by the polishing unit 300 facing downwards. One embodiment may be configured so that when the substrate WF is detected by the sensor 112a of the load unit 100, the conveyance rollers 202 of the load unit 100 start operating. The reader 106 reads out the ID of the substrate WF introduced into the load unit 100. The processing in the substrate processing apparatus 1000 may be decided according to the read ID. If it is determined from the read ID that the introduced substrate WF is not a workpiece to be processed by the substrate processing apparatus 1000, the conveyance of the substrate WF by the conveyance rollers 202 may be suspended. The substrate WF is conveyed by the conveyance rollers 202 within the load unit 100 and detected by the sensor 112c. When the substrate WF is detected by the sensor 112c, and if the conveyance unit 200A is ready to receive the substrate WF, the inlet shutter 218 of the conveyance unit 200A is opened, and the substrate WF is conveyed by the conveyance rollers 202 from the load unit 100 to the conveyance unit 200A. If the conveyance unit 200A is not ready to receive the substrate WF, the operation of the conveyance rollers 202 of the load unit 100 is suspended until the conveyance unit 200A becomes ready to receive the substrate WF.

Once the substrate WF is conveyed to the conveyance unit 200A, the sensor 216a disposed on the inlet side of the conveyance unit 200A detects the substrate WF. When the sensor 216a detects the passing of a rear edge of the substrate WF, the inlet shutter 218 is closed. The substrate WF is then conveyed by the conveyance rollers 202 of the conveyance unit 200A while the sensor 216b is monitoring the position of the substrate WF. At this point of time, the stopper 220 is transferred into the conveyance route of the substrate WF by the stopper transfer mechanism 222. The substrate WF conveyed on the conveyance rollers 202 comes into contact with the stopper 220 to be stopped. The sensor 216c is disposed in the position of the stopper 220.

When the substrate WF is detected by the sensor 216c, the operation of the conveyance rollers 202 is suspended. The substrate WF stopped at the position (substrate delivery position) of the stopper 220 is delivered to the top ring 302 of the polishing unit 300A using the pusher 230.

After the substrate WF is stopped at the substrate delivery position, the arm 360 of the polishing unit 300A is swung to place the top ring 302 above the substrate WF on the conveyance unit 200A. Subsequently, the first stage 232 and the second stage 270 of the pusher 230 are elevated, and the substrate WF on the conveyance rollers 202 is received by the second stage 270. The first stage 232 of the pusher 230 supports the retainer member 3 of the top ring 302, and the second stage 270 is further elevated. In this state, the top ring 302 holds the substrate WF on the lower surface of the elastic membrane 4 by vacuum suction.

After the substrate WF is held by the top ring 302, the swing arm 360 is swung to move the top ring 302 holding the substrate WF to an opposite position to the polishing pad 352 of the polishing unit 300A. The polishing table 350 and the top ring 302 are then rotated, and at the same time, the substrate WF is pressed against the polishing pad 352 to be polished. During the polishing of the substrate WF, the polishing liquid is fed onto the surface of the polishing pad 352 through the polishing liquid feeding nozzle 354 and the passage 353.

When the polishing of the substrate WF in the polishing unit 300A is finished, the swing arm 360 is swung to move the top ring 302 holding the substrate WF to the substrate delivery position of the conveyance unit 200A. The top ring 302 is moved so that the retainer member 3 of the top ring 302 is supported by the first stage 232, and that the substrate WF is supported by the second stage 270. The vacuum suction of the top ring 302 is then released, and the substrate WF is supported by the supporting pole 272 of the second stage 270. The pusher 230 is then lowered, and the substrate WF is delivered onto the conveyance rollers 202.

After the polishing of the substrate WF is finished in the polishing unit 300A, the polishing pad 352 is subjected to dressing, washing and the like by using the dresser 356, the atomizer 358 and the like in the polishing unit 300A.

After the substrate WF is delivered from the polishing unit 300A to the conveyance unit 200A, the conveyance rollers 202 are driven again to convey the substrate WF. The sensor 216d is disposed at a position where the washing of the substrate WF is started. When the substrate WF is detected by the sensor 216d, the washing of the substrate WF is started. At the time of the washing of the substrate WF, the rotating speed of the conveyance rollers 202 may be changed to speed for washing. The substrate WF is conveyed by the conveyance rollers 202, and simultaneously, the washing liquid is injected from the upper washing nozzle 284a and the lower washing nozzle 284b toward the substrate WF, to thereby wash the substrate WF. The sensor 216e is disposed in the washing section. The substrate WF is conveyed and washed at the same time while the position of the substrate WF is monitored by the sensor 216e. The sensor 216f is disposed at a position where the washing of the substrate WF is finished. When the substrate WF is detected by the sensor 216f, the injection of the washing liquid from the upper washing nozzle 284a and the lower washing nozzle 284b is suspended. When the washing of the substrate WF is finished, the rotating speed of the conveyance rollers 202 is changed to speed for conveyance. The sensor 216g is disposed near the outlet of the conveyance unit 200A. When the substrate WF is detected by the sensor 216g, and if the conveyance unit 200B which is a subsequent unit is ready to receive the substrate WF, the outlet shutter 286 is opened to convey the substrate WF from the conveyance unit 200A to the conveyance unit 200B. If the polishing unit 300B is not ready to receive the substrate WF when the substrate WF is detected by the sensor 216g, the rotation of the conveyance rollers 202 is suspended until the polishing unit 300B becomes ready to receive the substrate WF, and the substrate WF is brought into a standby state.

According to one embodiment, the processing of the substrate WF in the conveyance unit 200B may be similar to that in the conveyance unit 200A. In this processing, each of the substrates WF is typically subjected to two-step polishing by the polishing units 300A and 300B. According to one embodiment, the substrate WF may be polished by only either the polishing unit 300A or 300B (only one-step polishing). For example, if the substrate WF is polished only by the polishing unit 300A and is not polished by the polishing unit 300B, the delivery of the substrate WF to the polishing unit 300B and the washing of the substrate WF are not carried out in the conveyance unit 200B, and the substrate WF is conveyed by the conveyance rollers 202 to be delivered to the drying unit 500 which is the subsequent unit. If the substrate WF is polished only by the polishing unit 300B and is not polished by the polishing unit 300A, the delivery of the substrate WF to the polishing unit 300A and the washing of the substrate WF are not carried out in the conveyance unit 200A, and the substrate WF is conveyed by the conveyance rollers 202 to be delivered to the conveyance unit 200B which is the subsequent unit.

In the substrate processing apparatus 1000 shown in FIG. 1, the substrate WF is conveyed from the conveyance unit 200B to the drying unit 500. When the substrate WF is introduced into the drying unit 500, the outlet shutter 286 of the conveyance unit 200B and the inlet shutter 502 of the drying unit 500 are opened. The substrate WF is then conveyed by the conveyance rollers 202 from the conveyance unit 200B to the drying unit 500. When it is detected that the substrate WF passes through the sensor 504a disposed near the inlet of the drying unit 500, the inlet shutter 502 of the drying unit 500 and the outlet shutter 286 of the conveyance unit 200B are closed. The sensor 504b is disposed at a position where the drying of the substrate WF by the drying unit 500 is started. When the substrate WF is conveyed by the conveyance rollers 202 within the drying unit 500 and detected by the sensor 504b, gas is injected from the lower nozzle 530a and the upper nozzle 530b. The sensor 504c is disposed near the outlet of the drying unit 500. When the substrate WF is detected by the sensor 504c, the gas injection from the lower nozzle 530a and the upper nozzle 530b is suspended. Furthermore, when the substrate WF is detected by the sensor 504c, the outlet shutter 540 is opened, and the substrate WF is conveyed from the drying unit 500 to the unload unit 600.

After being conveyed to the unload unit 600, the substrate WF is conveyed to the outlet by the conveyance rollers 202 while being monitored by the sensors 612a to 612c. The substrate WF is then conveyed out of the substrate processing apparatus 1000 through the outlet opening 608. Disposed on an outlet side of the unload unit 600 is another processing apparatus for conducting the subsequent processing steps for the substrate WF. The substrate WF is delivered from the unload unit 600 to the processing apparatus for conducting the subsequent processing steps.

In the substrate processing apparatus 1000 shown in FIG. 1, the conveyance unit 200 and the polishing unit 300 comprise two conveyance units and two polishing units, respectively. However, the conveyance unit 200 and the polishing unit 300 may each comprise one unit and may each comprise three or more units. As discussed above, the load unit 100, the conveyance unit 200, the polishing unit 300, the drying unit 500, and the unload unit 600 may be configured as discrete units.

At least the following technical ideas can be understood from the above-discussed embodiments.

Embodiment 1

Embodiment 1 provides a top ring for holding a substrate. The top ring comprises a substrate supporting surface, a retainer member disposed to surround an outer periphery of the substrate supporting surface, and a retainer guiding device configured to guide the retainer member so as to allow the retainer member to be displaced in a direction perpendicular to the substrate supporting surface, and support the retainer member so as to inhibit the retainer member from being displaced in a direction parallel to and away from the substrate supporting surface. The retainer guiding device is disposed in an inner side of the retainer member surrounding the substrate supporting surface.

Embodiment 2

According to Embodiment 2, the top ring of the Embodiment 1 is so configured that the retainer guiding device includes a supporting roller, and that the supporting roller has a rotation axis parallel to the substrate supporting surface.

Embodiment 3

According to Embodiment 3, the top ring of the Embodiment 1 or 2 is so configured that the substrate supporting surface is substantially quadrangular.

Embodiment 4

According to Embodiment 4, the top ring of any one of the Embodiments 1 to 3 is so configured that the retainer member comprises a plurality of plate-like members, and that at least one of the retainer members is provided correspondingly to each side of the substrate supporting surface having a quadrangular shape.

Embodiment 5

According to Embodiment 5, the top ring of any one of the Embodiments 1 to 4 is so configured that the retainer guiding device comprises a plurality of retainer guiding devices, and that at least one of the retainer guiding devices is provided correspondingly to each side of the substrate supporting surface having a substantially quadrangular shape so as to guide and support the retainer member located at an opposite position to the each side.

Embodiment 6

According to Embodiment 6, the top ring of any one of the Embodiments 1 to 5 includes a retainer driving device for displacing the retainer member in the direction perpendicular to the substrate supporting surface.

Embodiment 7

According to Embodiment 7, the top ring of the Embodiment 6 is so configured that the retainer driving device includes a cylinder which is capable of receiving gas inside, a diaphragm disposed in the cylinder, and a piston which is displaceable according to motion of the diaphragm, and that the retainer member is movable by the piston.

Embodiment 8

According to Embodiment 8, the top ring of the Embodiment 6 or 7 is so configured that the retainer driving device comprises a plurality of retainer driving devices, and that at least one of the retainer driving devices is provided according to the retainer member corresponding to each side of the substrate supporting surface having a substantially quadrangular shape so as to drive the retainer member located at an opposite position to the each side.

Embodiment 9

According to Embodiment 9, the top ring of the Embodiment 8 is so configured that the plurality of retainer driving devices have identical dimensions.

Embodiment 10

According to Embodiment 10, the top ring of any one of the Embodiments 1 to 9 is so configured that the substrate supporting surface includes an elastic member, and that the elastic member defines at least one portion of a pressure chamber.

Embodiment 11

According to Embodiment 11, the top ring of the Embodiment 10 is so configured that the elastic member defines a plurality of pressure chambers.

Embodiment 12

According to Embodiment 12, the top ring of the Embodiment 10 or 11 includes a passage for feeding gas to the pressure chambers.

Embodiment 13

According to Embodiment 13, a substrate processing apparatus is provided. The substrate processing apparatus comprises the top ring of any one of the Embodiments 1 to 12, and a polishing table configured to hold a polishing pad.

REFERENCE SIGN LIST

2: Top ring body
3: Retainer member
4: Elastic membrane
4*a*: Partition wall
18: Top ring shaft
50: Dresser
300: Polishing unit
302: Top ring
303: Upper member
304: Intermediate member
306: Lower member
315: Vacuum aperture
319: Vertical motion mechanism
350: Polishing table
352: Polishing pad
354: Polishing liquid feeding nozzle 355: Opening portion
356: Dressing unit
357: Through-hole
358: Atomizer
360: Swing arm
380: Retainer portion
402: Upper housing
404: Lower housing
406: Cylinder
408: Diaphragm
410: Piston
412: Retainer supporting guide
414: Band
415: Seal packing
416: Retainer guide
418: Supporting pad
420: Retainer supporting frame
424: Shaft
426: Low friction sliding bearing
450: Supporting roller
900: Controller
1000: Substrate processing apparatus
WF: Substrate

What is claimed is:

1. A top ring for holding a substrate, comprising:
a substrate supporting surface;
a retainer member disposed to surround an outer periphery of the substrate supporting surface, the retainer member directly facing an edge of the substrate when the substrate is supported on the substrate supporting surface; and
a retainer guiding device configured to guide the retainer member so as to allow the retainer member to be displaced in a direction perpendicular to the substrate supporting surface, and support the retainer member so as to inhibit the retainer member from being displaced in a direction parallel to and away from the substrate supporting surface, wherein
the retainer guiding device is disposed in an inner side of the retainer member surrounding the substrate supporting surface.
wherein the top ring comprises a retainer supporting guide for supporting the retainer member; and
a supporting pad fixed on an inner lateral surface of the retainer supporting guide, the supporting pad made of resin,
wherein the retainer guiding device includes a supporting roller contactable with the supporting pad, and the supporting roller has a rotation axis parallel to the substrate supporting surface
the supporting roller is made of a metal.

2. The top ring according to claim 1, wherein
the substrate supporting surface is substantially quadrangular.

3. The top ring according to claim 1, wherein
the substrate supporting surface has a quadrangular shape, and
the retainer member comprises a plurality of plate-like members, and at least one of the retainer members is disposed correspondingly to each side of the substrate supporting surface having the quadrangular shape.

4. The top ring according to claim 1, wherein
the substrate supporting surface has a quadrangular shape, and
the retainer guiding device comprises a plurality of retainer guiding devices, and at least one of the retainer guiding devices is provided correspondingly to each side of the substrate supporting surface having the quadrangular shape so as to guide and support the retainer member located at an opposite position to the each side.

5. The top ring according to claim 1, comprising a retainer driving device for displacing the retainer member in the direction perpendicular to the substrate supporting surface.

6. The top ring according to claim 5, wherein
the retainer driving device includes:
a cylinder capable of receiving gas inside;
a diaphragm disposed in the cylinder; and
a piston which is displaceable according to motion of the diaphragm, and wherein
the retainer member is movable by the piston.

7. The top ring according to claim 5, wherein
the substrate supporting surface has a quadrangular shape, and
the retainer driving device comprises a plurality of retainer driving devices, and at least one of the retainer driving devices is provided according to the retainer member corresponding to each side of the substrate supporting surface having the quadrangular shape so as to drive the retainer member located at an opposite position to the each side.

8. The top ring according to claim 7, wherein
the plurality of retainer driving devices have identical dimensions.

9. The top ring according to claim 1, wherein
the substrate supporting surface includes an elastic member, and wherein
the elastic member defines at least one portion of a pressure chamber.

10. The top ring according to claim 9, wherein
the elastic member defines a plurality of pressure chambers.

11. The top ring according to claim 9, including a passage for feeding gas to the pressure chamber.

12. A substrate processing apparatus comprising:
a top ring for holding a substrate, comprising:
a substrate supporting surface;
a retainer member disposed to surround an outer periphery of the substrate supporting surface, the retainer member directly facing an edge of the substrate when the substrate is supported on the substrate supporting surface; and
a retainer guiding device configured to guide the retainer member so as to allow the retainer member to be displaced in a direction perpendicular to the substrate supporting surface, and support the retainer member so as to inhibit the retainer member from being displaced in a direction parallel to and away from the substrate supporting surface,
wherein the retainer guiding device is disposed in an inner side of the retainer member surrounding the substrate supporting surface; and
a polishing table configured to hold a polishing pad,
wherein the top ring comprises a retainer supporting guide for supporting the retainer member; and
a supporting pad fixed on an inner lateral surface of the retainer supporting guide, the supporting pad made of resin,
wherein the retainer guiding device includes a supporting roller contactable with the supporting pad, and the supporting roller has a rotation axis parallel to the substrate supporting surface
the supporting roller is made of a metal.

13. The top ring according to claim 1, wherein
the retainer member and the retainer guiding device are configured to rotate along with the substrate supporting surface.

14. The top ring according to claim 1, wherein a rotating force for rotating the substrate support surface is transmitted through the supporting roller.

15. The top ring according to claim 1, wherein
the supporting roller and the supporting pad are configured to constantly be in contact each other.

16. The top ring according to claim 1, wherein
the supporting roller and the supporting pad are configured that a gap exists between the support roller and the supporting pad.

17. The substrate processing apparatus according to claim 12, wherein
the supporting roller and the supporting pad are configured to constantly be in contact each other.

18. The substrate processing apparatus according to claim 12, wherein
the supporting roller and the supporting pad are configured that a gap exists between the support roller and the supporting pad.

* * * * *